(12) United States Patent
Chen et al.

(10) Patent No.: US 12,112,977 B2
(45) Date of Patent: *Oct. 8, 2024

(54) REDUCING SPACING BETWEEN CONDUCTIVE FEATURES THROUGH IMPLANTATION

(71) Applicant: Taiwan Semiconductor Manufacturing Co., Ltd., Hsinchu (TW)

(72) Inventors: Kuo-Ju Chen, Taichung (TW); Su-Hao Liu, Jhongpu Township (TW); Liang-Yin Chen, Hsinchu (TW); Huicheng Chang, Tainan (TW); Yee-Chia Yeo, Hsinchu (TW); Meng-Han Chou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/190,297

(22) Filed: Mar. 27, 2023

(65) Prior Publication Data

US 2023/0253243 A1 Aug. 10, 2023

Related U.S. Application Data

(63) Continuation of application No. 17/150,552, filed on Jan. 15, 2021, now Pat. No. 11,615,982.

(51) Int. Cl.
*H01L 21/768* (2006.01)
*H01L 23/522* (2006.01)
*H01L 29/78* (2006.01)

(52) U.S. Cl.
CPC .. *H01L 21/76802* (2013.01); *H01L 21/76877* (2013.01); *H01L 23/5226* (2013.01); *H01L 29/785* (2013.01)

(58) Field of Classification Search
CPC ......... H01L 21/76802; H01L 21/76877; H01L 23/5226; H01L 29/785
See application file for complete search history.

(56) References Cited

U.S. PATENT DOCUMENTS 8,084,826 B2 12/2011 Kanegae et al.
10,002,788 B2 6/2018 Choi et al.
(Continued)

FOREIGN PATENT DOCUMENTS

DE 102019116996 A1 1/2020
DE 102020114875 A1 3/2021
(Continued)

*Primary Examiner* — Karen Kusumakar
(74) *Attorney, Agent, or Firm* — Slater Matsil, LLP

(57) ABSTRACT

A method includes forming a first dielectric layer over a source/drain region, and forming a source/drain contact plug over and electrically connecting to the source/drain region. A top portion of the source/drain contact plug has a first lateral dimension. An implantation process is performed to implant a dopant into the first dielectric layer. The implantation process results in the source/drain contact plug to have a second lateral dimension smaller than the first lateral dimension. The method further includes forming a second dielectric layer over the etch stop layer, and forming a gate contact plug adjacent to the source/drain contact plug.

20 Claims, 25 Drawing Sheets

(56) References Cited

U.S. PATENT DOCUMENTS

| | | |
|---|---|---|
| 10,332,878 B2 | 6/2019 | Fukutome |
| 10,763,168 B2 | 9/2020 | Hsieh et al. |
| 10,854,503 B2 | 12/2020 | Sun et al. |
| 11,069,812 B2 | 7/2021 | Kao et al. |
| 11,145,751 B2 | 10/2021 | Chen et al. |
| 2019/0348298 A1* | 11/2019 | Liu .................. H01L 29/66795 |
| 2020/0044025 A1 | 2/2020 | Liu et al. |
| 2020/0135641 A1 | 4/2020 | Lee et al. |

FOREIGN PATENT DOCUMENTS

| | | |
|---|---|---|
| DE | 102020114655 A1 | 9/2021 |
| JP | 2009194053 A | 8/2009 |
| KR | 20140000087 A | 1/2014 |
| KR | 20160148122 A | 12/2016 |
| TW | 201924062 A | 6/2019 |
| TW | 201942977 A | 11/2019 |
| TW | 202036911 A | 10/2020 |

* cited by examiner

REDUCING SPACING BETWEEN CONDUCTIVE FEATURES THROUGH IMPLANTATION

PRIORITY CLAIM AND CROSS-REFERENCE

This application is a continuation of U.S. patent application Ser. No. 17/150,552, entitled "Reducing Spacing Between Conductive Features Through Implantation," filed on Jan. 15, 2021, which application is incorporated herein by reference.

BACKGROUND

In the manufacturing of integrated circuits, contact plugs are used for electrically coupling to the source and drain regions and the gates of transistors. The source/drain contact plugs were typically connected to source/drain silicide regions, whose formation processes include forming contact openings to expose source/drain regions, depositing a metal layer, depositing a barrier layer over the metal layer, performing an anneal process to react the metal layer with the source/drain regions, filling a metal such as tungsten or cobalt into the remaining contact opening, and performing a Chemical Mechanical Polish (CMP) process to remove excess metal. There may be more than one level of contact plugs formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
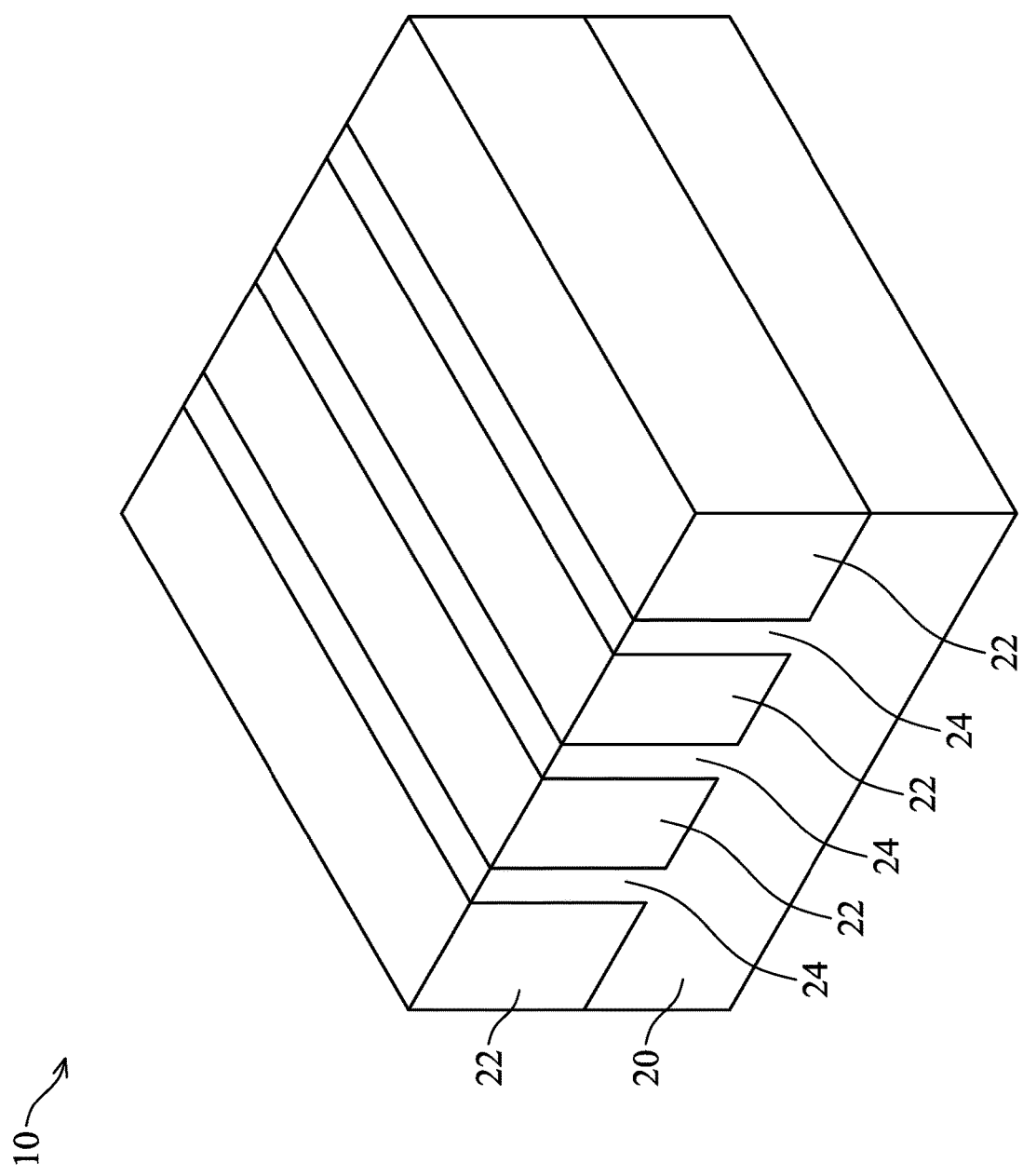
FIGS. 1-7, 8A, 8B, 9A, 9B, 10A, 10B, 11, 12A, 12B, 12C, 12D, and 13-15 are perspective views and cross-sectional views of intermediate stages in the formation of a transistor and the respective contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A contact plug and the method of forming the same are provided in accordance with some embodiments. The contact plug has greater lateral dimensions in its top portion than the bottom portion. An implantation process is performed to dope a dopant into a top portion of a dielectric layer, in which the contact plug is located, so that the lateral size of the top portion of the contact plug is reduced. Accordingly, the spacing between the contact plug and its neighboring conductive features is increased, and the leakage current between the contact plug and its neighboring conductive features is reduced. It is appreciated that although a Fin Field-Effect Transistor (FinFET) is used as an example, other types of transistors such as planar transistors, Gate-All-Around (GAA) transistors, or the like, may also adopt the embodiments of the present disclosure. Furthermore, although source/drain contact plugs are used as examples, other conductive features including, and not limited to, conductive lines, conductive plugs, conductive vias, and the like may also adopt the embodiments of the present disclosure to increase their spacing from their neighboring conductive features. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 19:
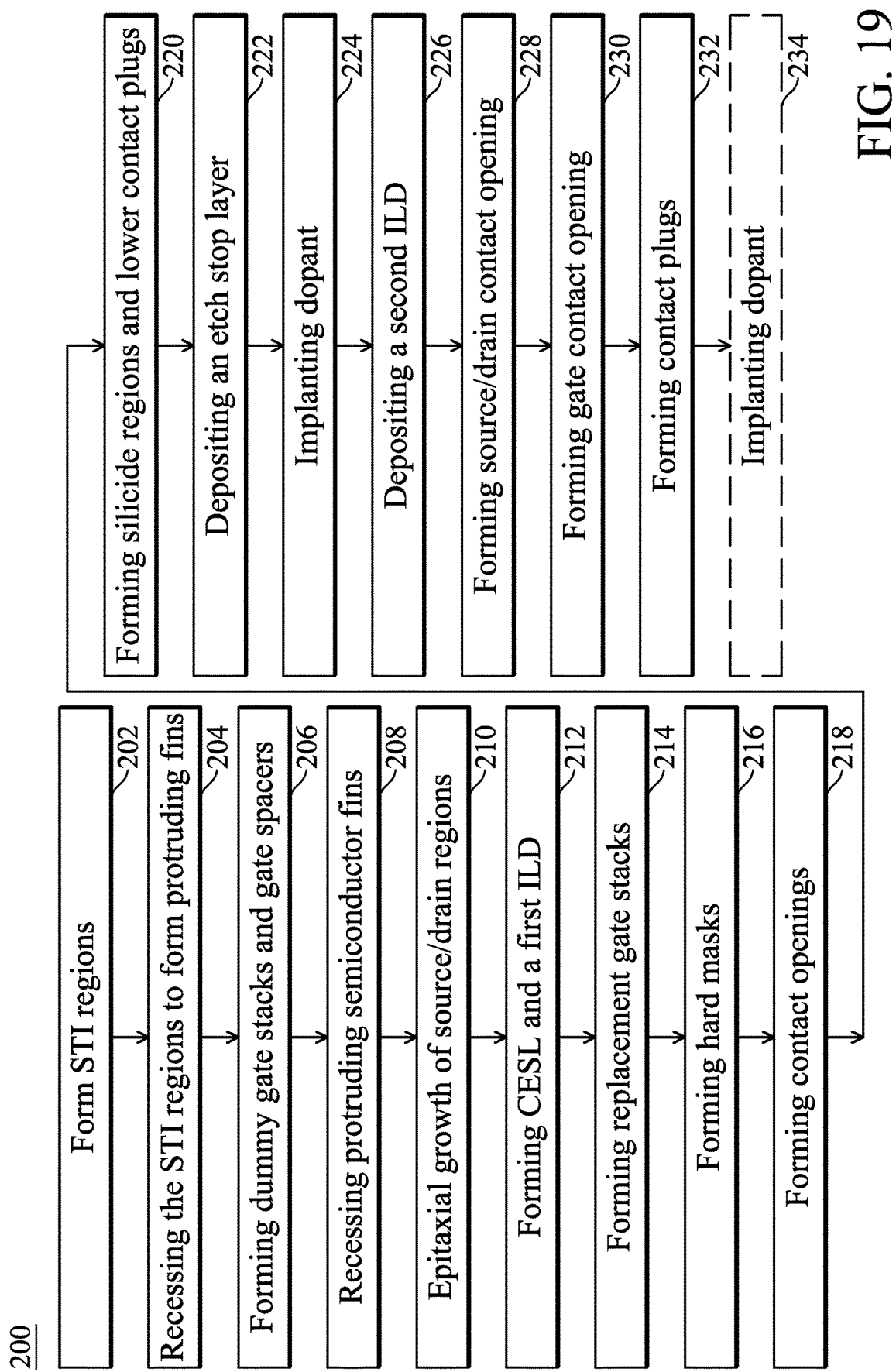
FIG. 19 illustrates a process flow for forming a Fin Field-Effect Transistor (FinFET) and corresponding contact plugs in accordance with some embodiments.

FIGS. 1-7, 8A, 8B, 9A, 9B, 10A, 10B, 11, 12A, 12B, 12C, 12D, and 13-15 illustrate the perspective views and cross-sectional views of intermediate stages in the formation of a Fin Field-Effect Transistor (FinFET) and the corresponding contact plugs in accordance with some embodiments of the present disclosure. The corresponding processes are also reflected schematically in the process flow 200 as shown in FIG. 19.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 19. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to grow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide layer formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
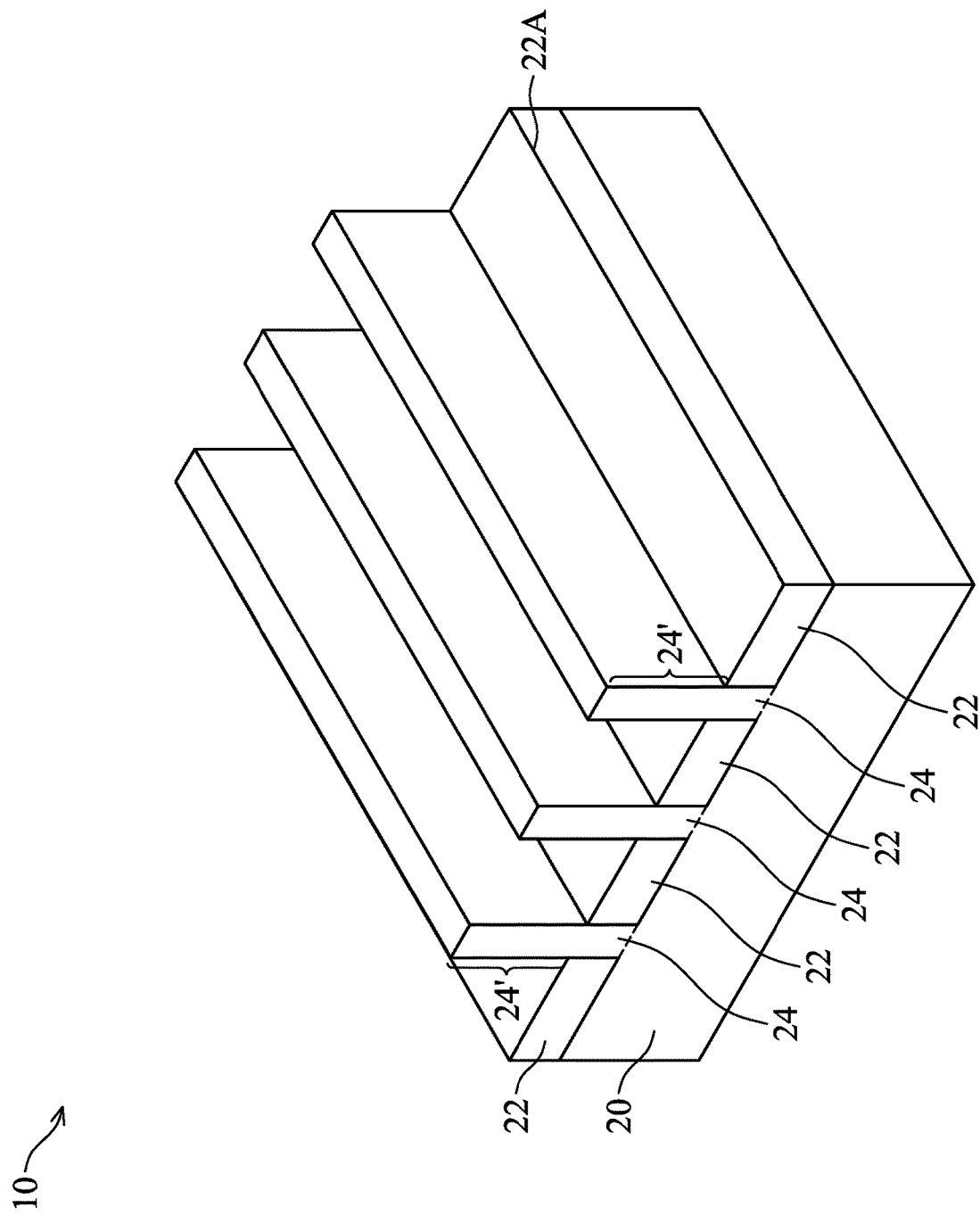

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 204 in the process flow 200 shown in FIG. 19. The etching may be performed using a dry etching process, for example, using $NF_3$ and $NH_3$ as the etching gases. In accordance with alternative embodiments of the present disclosure, the recessing of STI regions 22 is performed using a wet etching process. The etching chemical may include diluted HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
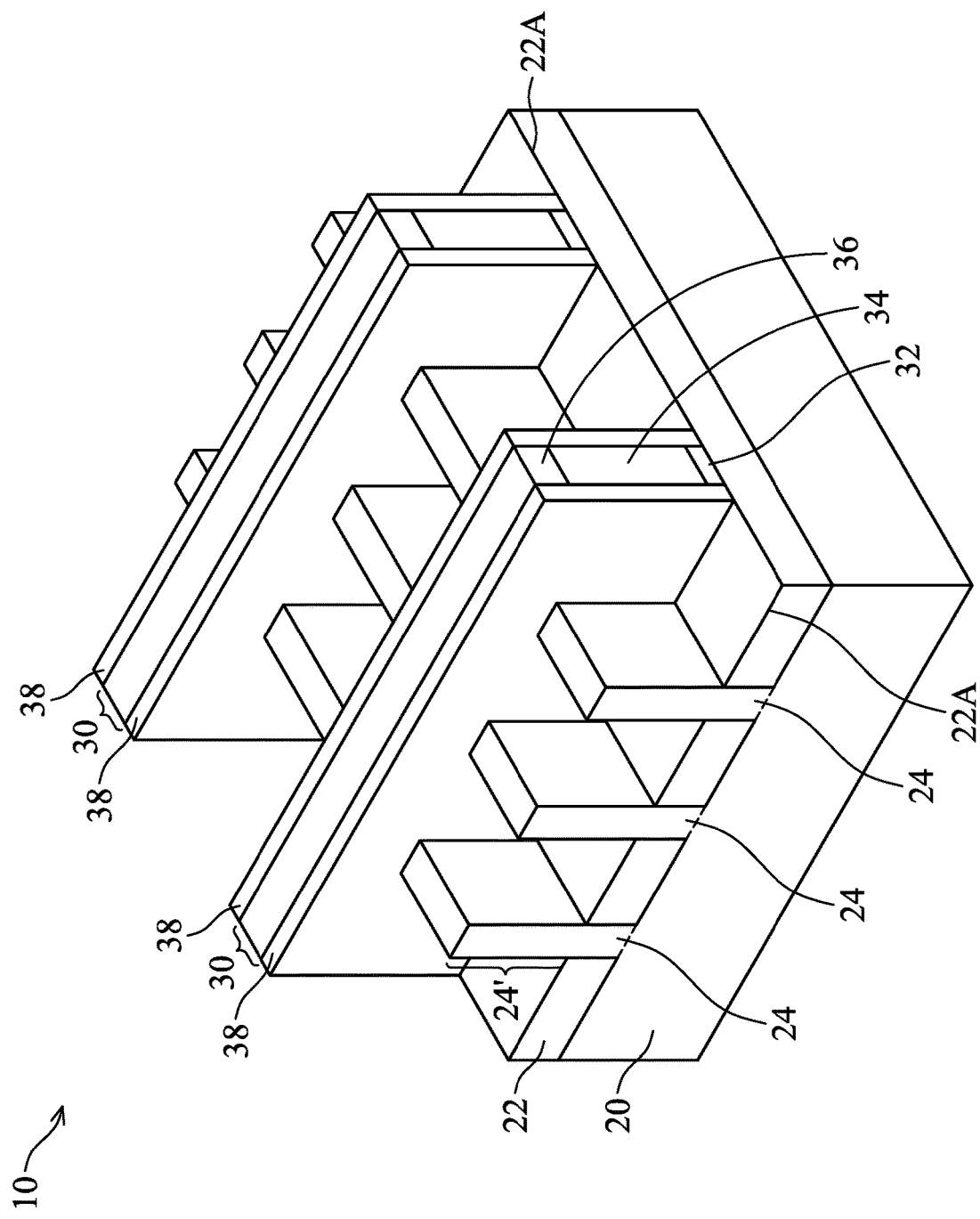

Referring to FIG. 3, dummy gate stacks 30 are formed to extend on the top surfaces and the sidewalls of (protruding) fins 24'. The respective process is illustrated as process 206 in the process flow 200 shown in FIG. 19. Dummy gate stacks 30 may include dummy gate dielectrics 32 and dummy gate electrodes 34 over the respective dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon oxy-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 shown in FIG. 19. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
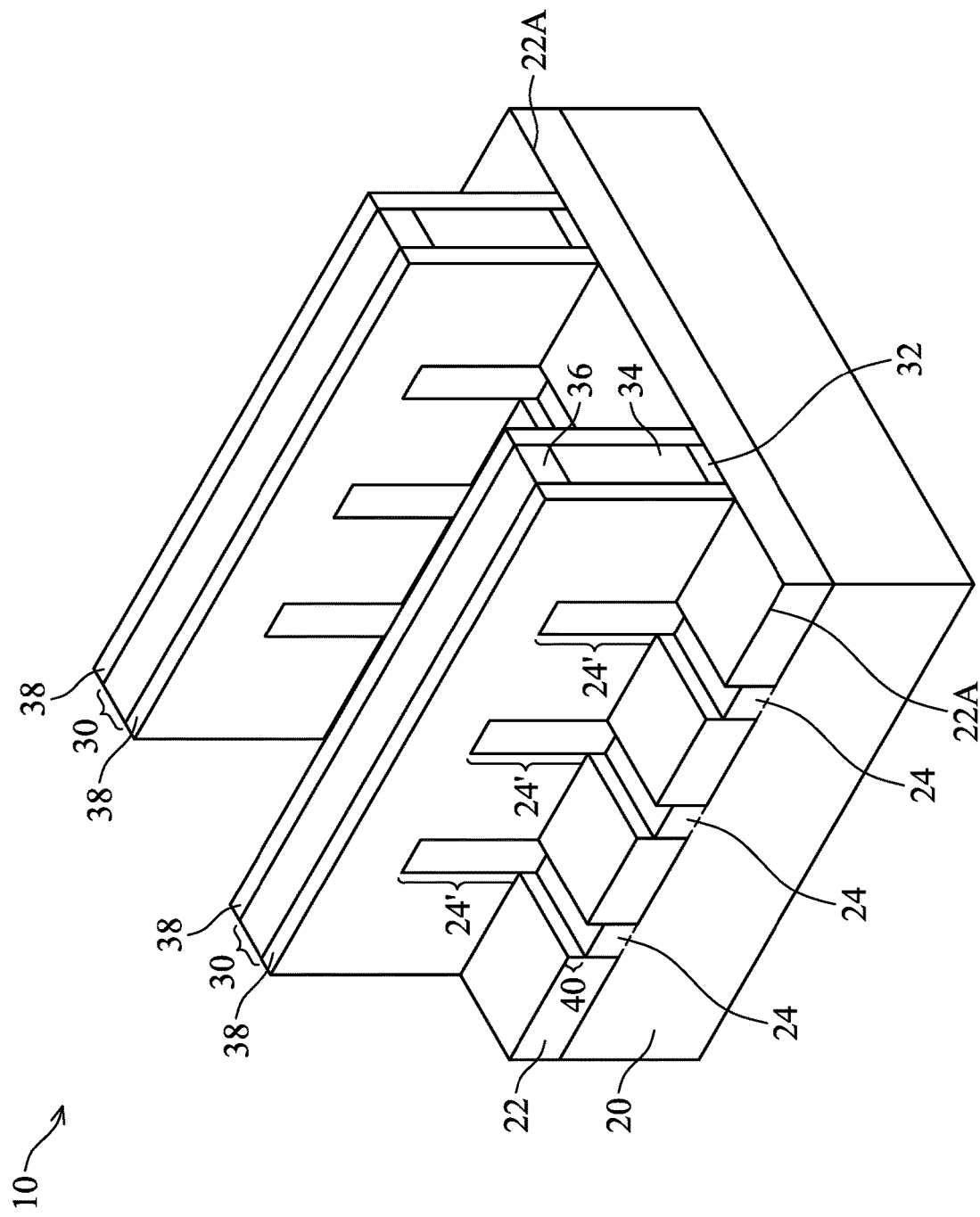

An etching process is then performed to etch the portions of protruding fins 24' that are not covered by dummy gate stack 30 and gate spacers 38, resulting in the structure shown in FIG. 4. The respective process is illustrated as process 208 in the process flow 200 shown in FIG. 19. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
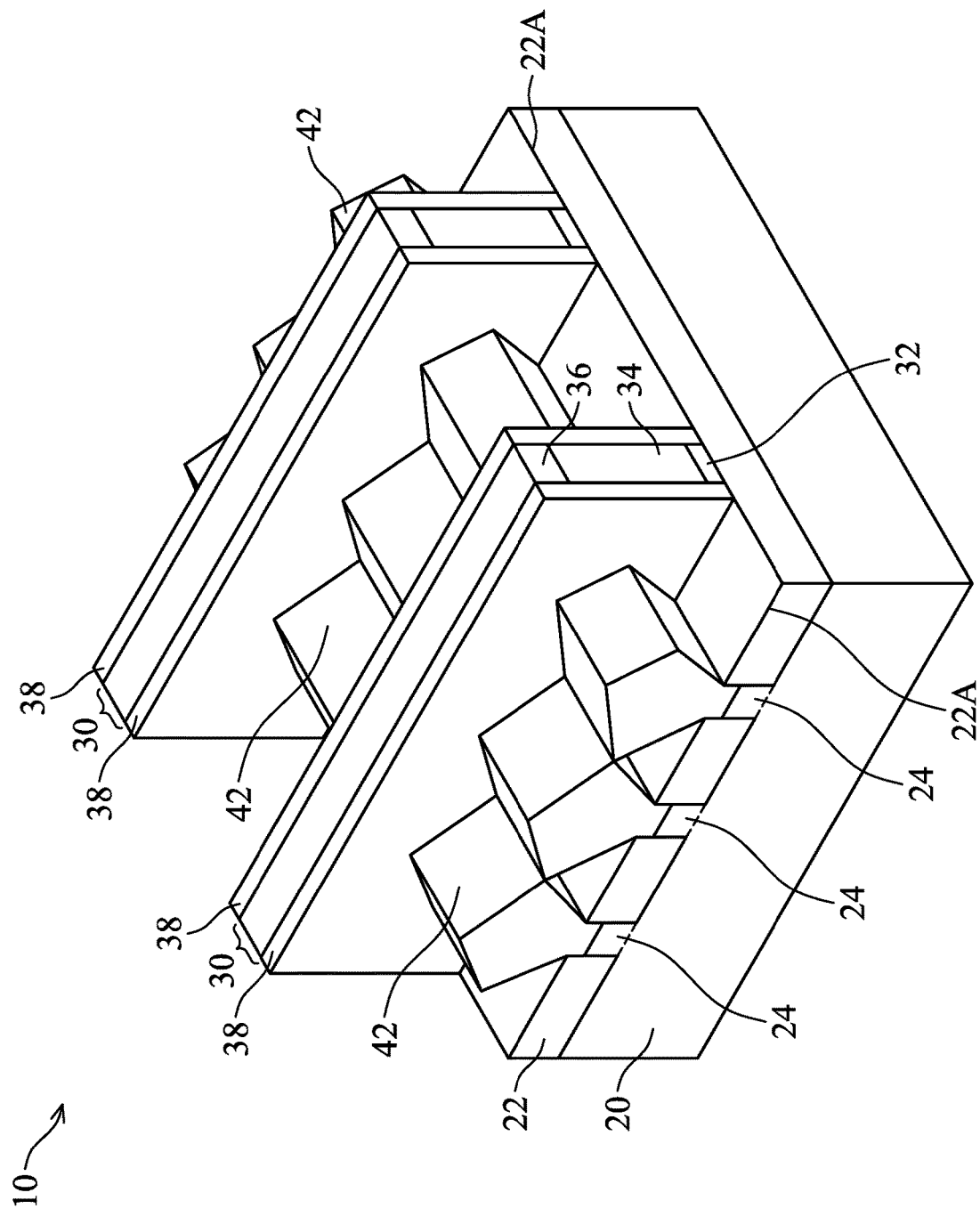
Figure 6:
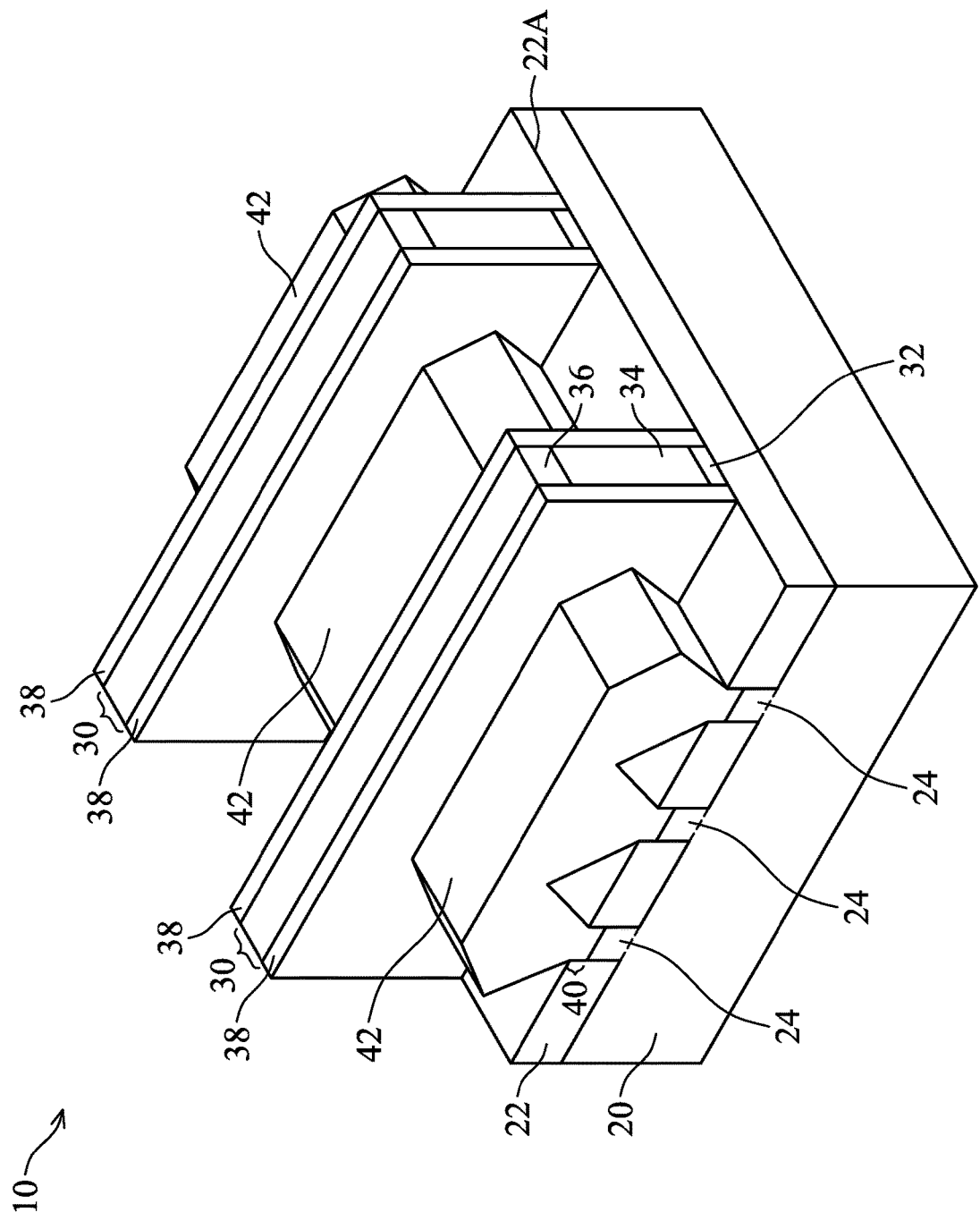

Next, as shown in FIG. 5, epitaxy regions (source/drain regions) 42 are formed by selectively growing (through epitaxy) a semiconductor material in recesses 40. The respective process is illustrated as process 210 in the process flow 200 shown in FIG. 19. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

After the epitaxy process, epitaxy regions 42 may be further implanted with a p-type or an n-type impurity to form source and drain regions, which are also denoted using reference numeral 42. In accordance with alternative embodiments of the present disclosure, the implantation process is skipped when epitaxy regions 42 are in-situ doped with the p-type or n-type impurity during the epitaxy.

Figure 7:
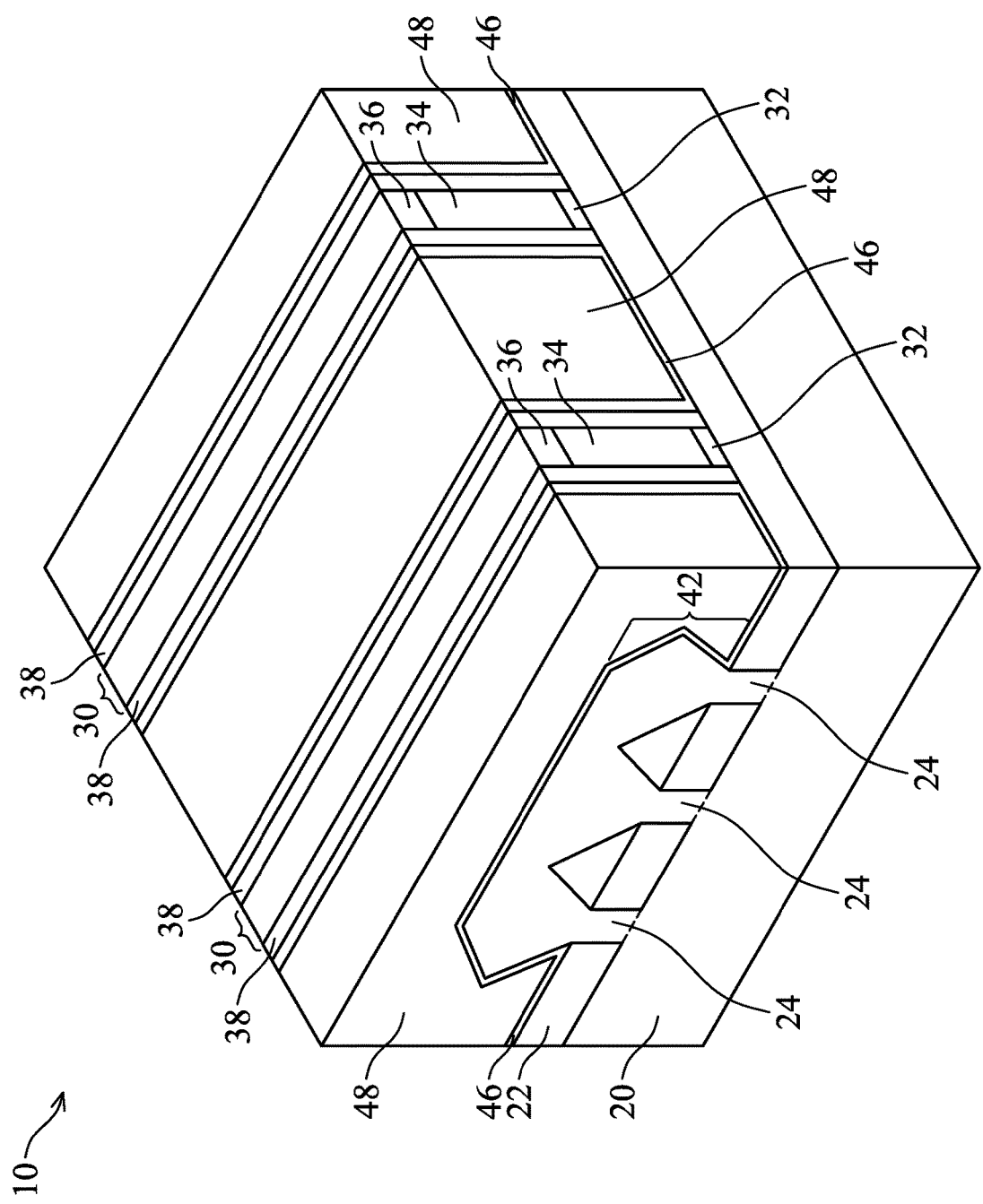

FIG. 7 illustrates a perspective view of the structure after the formation of Contact Etch Stop Layer (CESL) 46 and Inter-Layer Dielectric (ILD) 48. The respective process is illustrated as process 212 in the process flow 200 shown in FIG. 19. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition process. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. In accordance with some embodiments, ILD 48 comprises hydrogen with an atomic percentage greater than about 3 percent. The hydrogen percentage may also be in the range between about 1 percent and about 10 percent. In accordance with some embodiments, the increase in the hydrogen atomic percentage may be achieved by optimizing precursor concentration, flow rate, and/or partial pressure. A planarization process such as a Chemical Mechanical Polish (CMP) process or a mechanical grinding process may be performed to level the top surfaces of ILD 48, dummy gate stacks 30, and gate spacers 38 with each other.

Figure 8A:
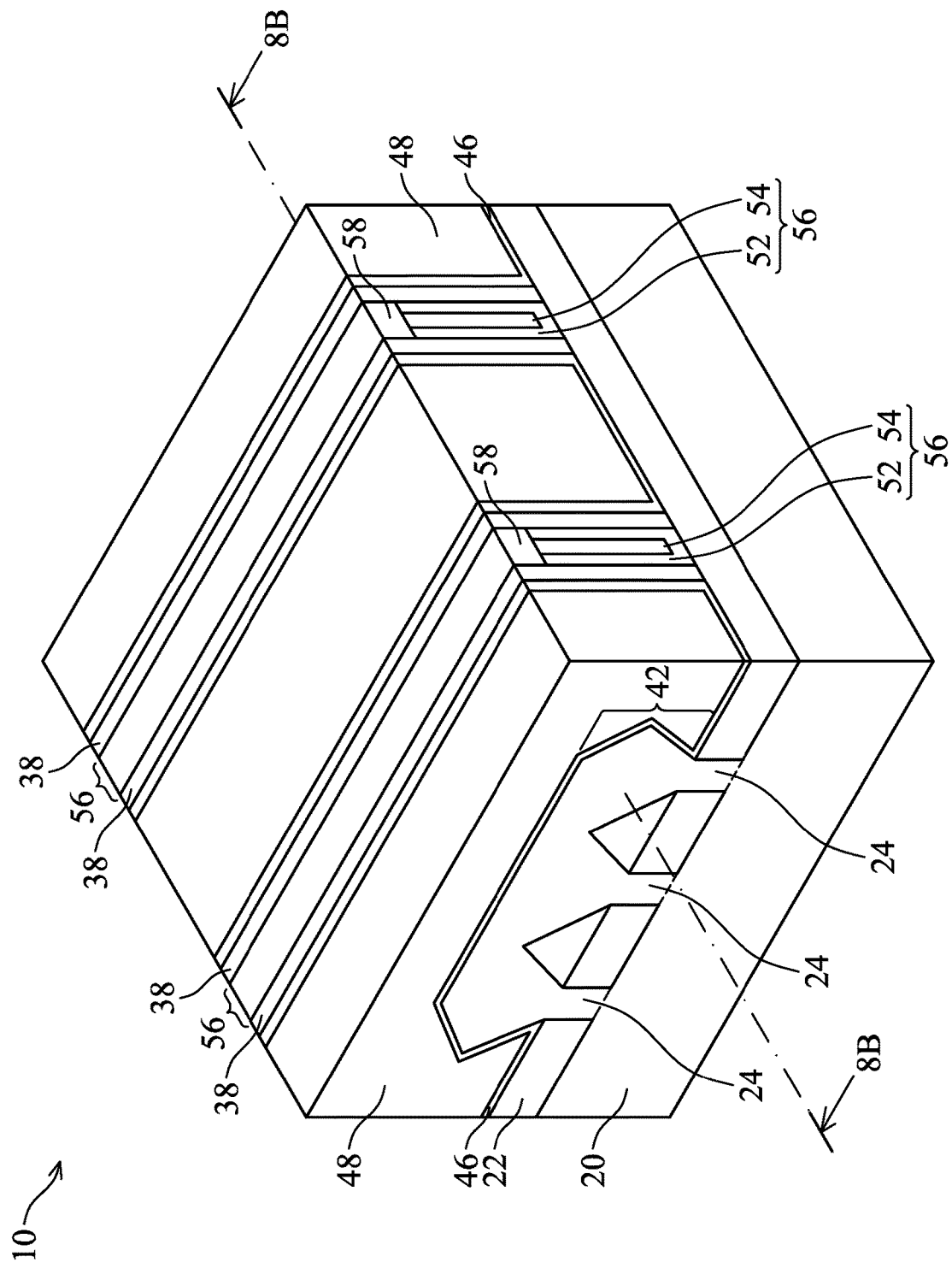
Figure 8B:
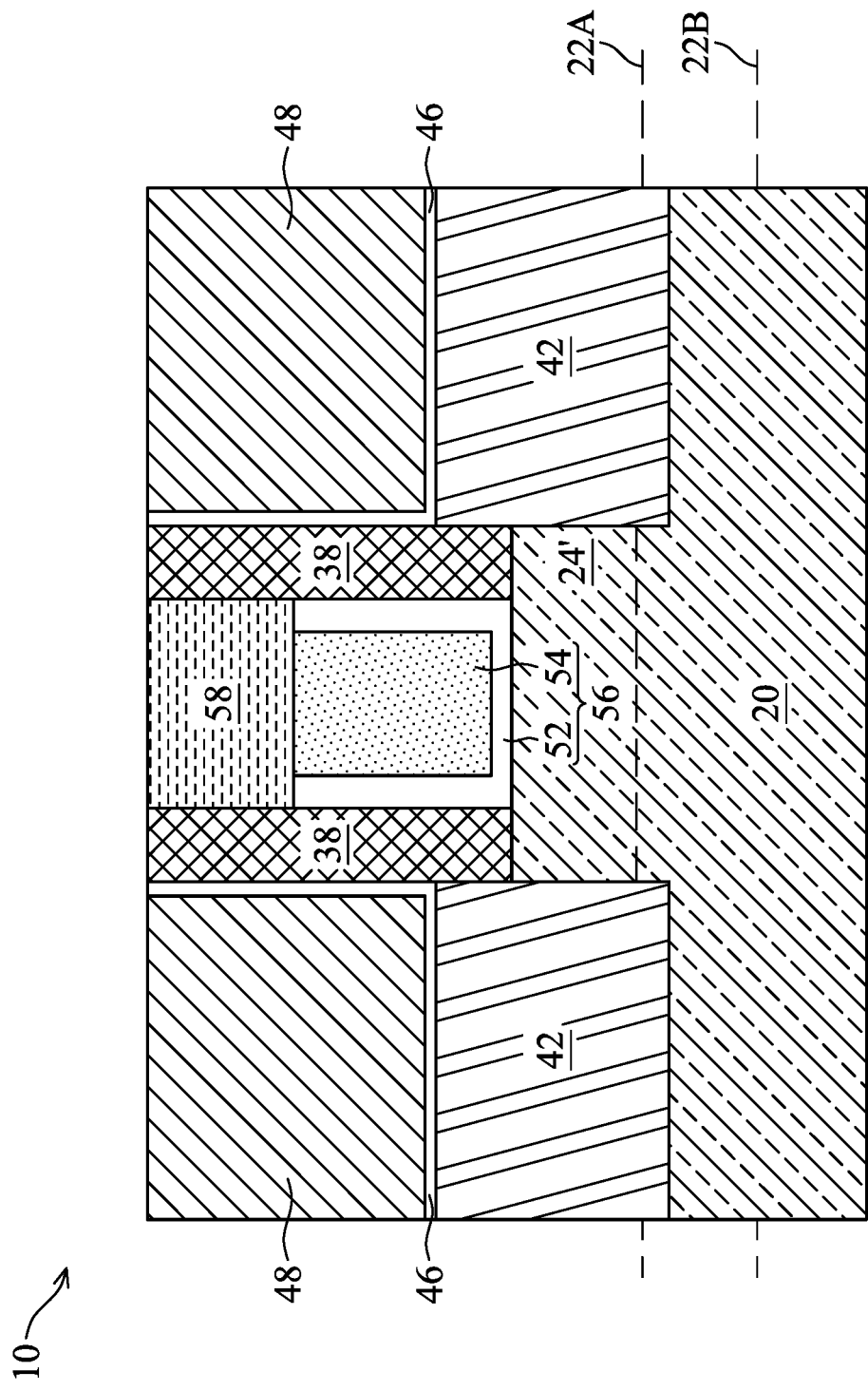

Next, dummy gate stacks 30, which include hard mask layers 36, dummy gate electrodes 34, and dummy gate dielectrics 32 are replaced with replacement gate stacks 56, which include metal gate electrodes 54 and gate dielectrics 52 as shown in FIGS. 8A and 8B. The respective process is illustrated as process 214 in the process flow 200 shown in FIG. 19. When forming replacement gate stacks 56, hard mask layers 36, dummy gate electrodes 34, and dummy gate dielectrics 32 as shown in FIG. 7 are first removed in one or a plurality of etching processes, resulting in trenches/openings to be formed between gate spacers 38. The top surfaces and the sidewalls of protruding semiconductor fins 24' are exposed to the resulting trenches.

Next, as shown in FIGS. 8A and 8B, which illustrate a perspective view and a cross-sectional view, respectively, replacement gate dielectric layers 52 are formed, which extend into the trenches between gate spacers 38. FIG. 8B illustrates the reference cross-section 8B-8B in FIG. 8A. In accordance with some embodiments of the present disclosure, each of gate dielectric layers 52 includes an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIGS. 8A and 8B, gate electrodes 54 are formed over gate dielectrics 52. Gate electrodes 54 include stacked conductive layers. The stacked conductive layers are not shown separately, while the stacked conductive layers may be distinguishable from each other. The deposition of the stacked conductive layers may be performed using a conformal deposition method(s) such as ALD or CVD. The stacked conductive layers may include a diffusion barrier layer (also sometimes referred to as a glue layer) and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a glue layer, which may be another TiN layer, is formed. The glue layer may or may not fully fill the trenches left by the removed dummy gate stacks.

The deposited gate dielectric layers and conductive layers are formed as conformal layers extending into the trenches, and include some portions over ILD 48. Next, if the glue layer does not fully fill the trenches, a metallic material is deposited to fill the remaining trenches. The metallic material may be formed of tungsten or cobalt, for example. Subsequently, a planarization process such as a CMP process or a mechanical grinding process is performed, so that the portions of the gate dielectric layers, stacked conductive layers, and the metallic material over ILD 48 are removed. As a result, gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

FIGS. 8A and 8B also illustrate the formation of (self-aligned) hard masks 58 in accordance with some embodiments. The respective process is illustrated as process 216 in the process flow 200 shown in FIG. 19. The formation of hard masks 58 may include performing an etching process to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxy-nitride, silicon oxy-carbo-nitride, or the like.

Figure 9A:
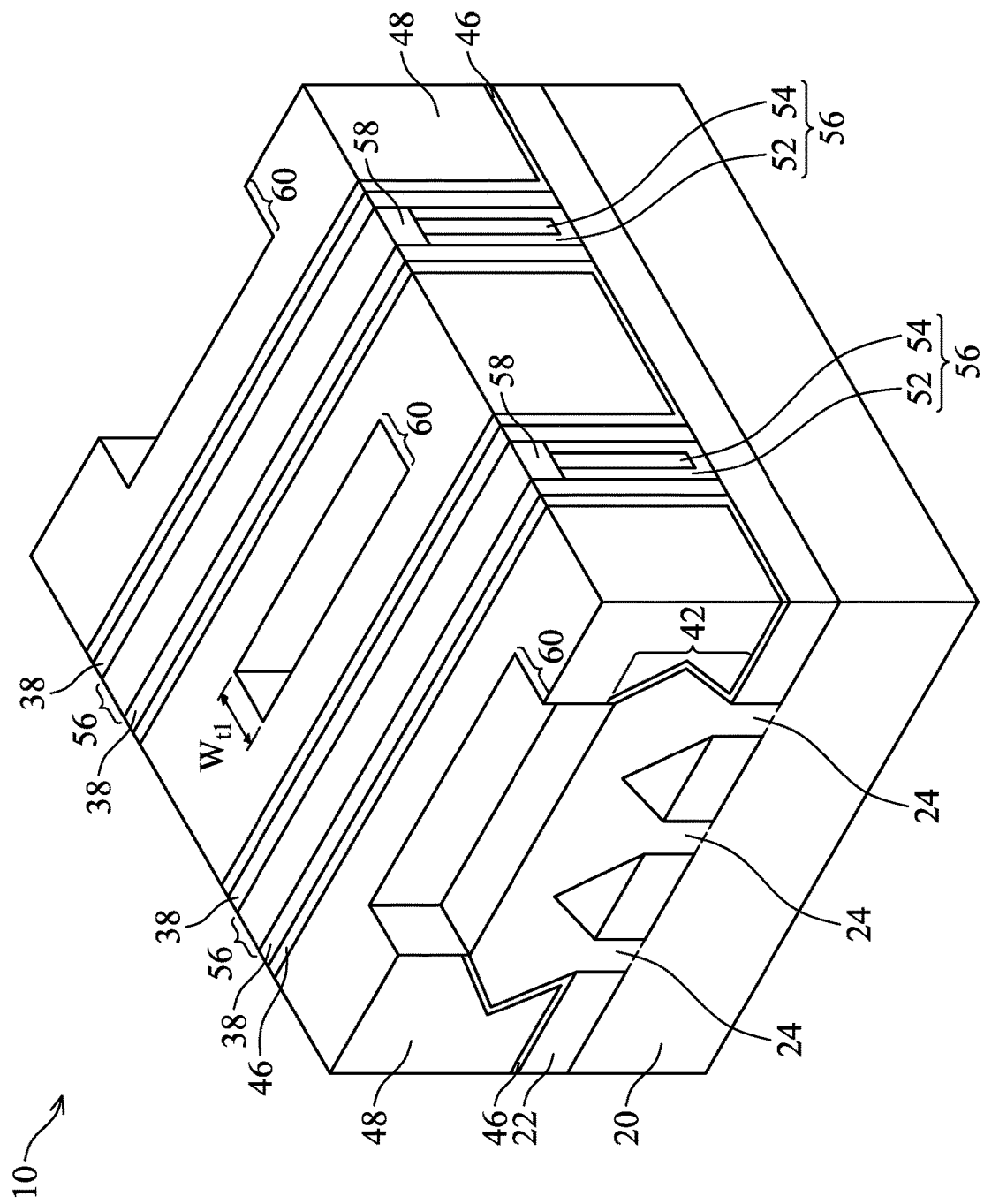
Figure 9B:
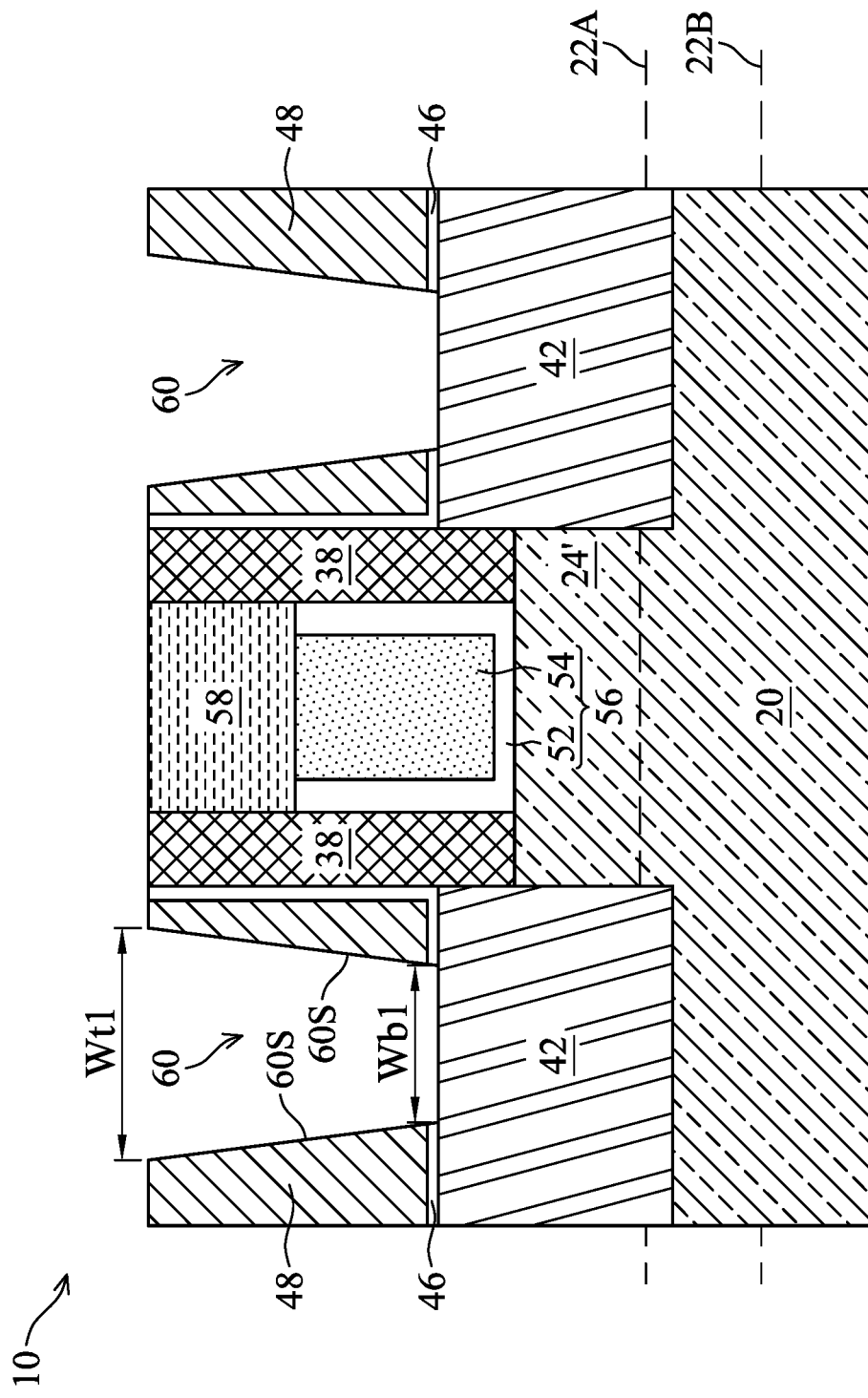

FIGS. 9A and 9B illustrate a perspective view and a cross-sectional view, respectively, in the formation of source/drain contact openings 60. The respective process is illustrated as process 218 in the process flow 200 shown in FIG. 19. The formation of contact openings 60 includes etching ILD 48 to expose the underlying portions of CESL 46, and then etching the exposed portions of CESL 46 to reveal epitaxy regions 42. In accordance with some embodiments of the present disclosure, as illustrated in FIG. 9A, gate spacers 38 are spaced apart from the nearest contact openings 60 by some remaining portions of ILD 48 and CESL 46. In accordance with other embodiments, the sidewalls of gate spacers 38 or CESL 46 are exposed to contact openings 60.

In accordance with some embodiments, as shown in FIG. 9B, contact openings 60 have top lateral dimensions (widths) Wt1 greater than the respective bottom dimensions Wb1. The differences (Wt1−Wb1) may be greater than about 3 nm, and may be in the range between about 1 nm and about 5 nm. The sidewalls 60S of ILD 48, which sidewalls face contact openings 60, may be substantially straight.

Figure 10A:
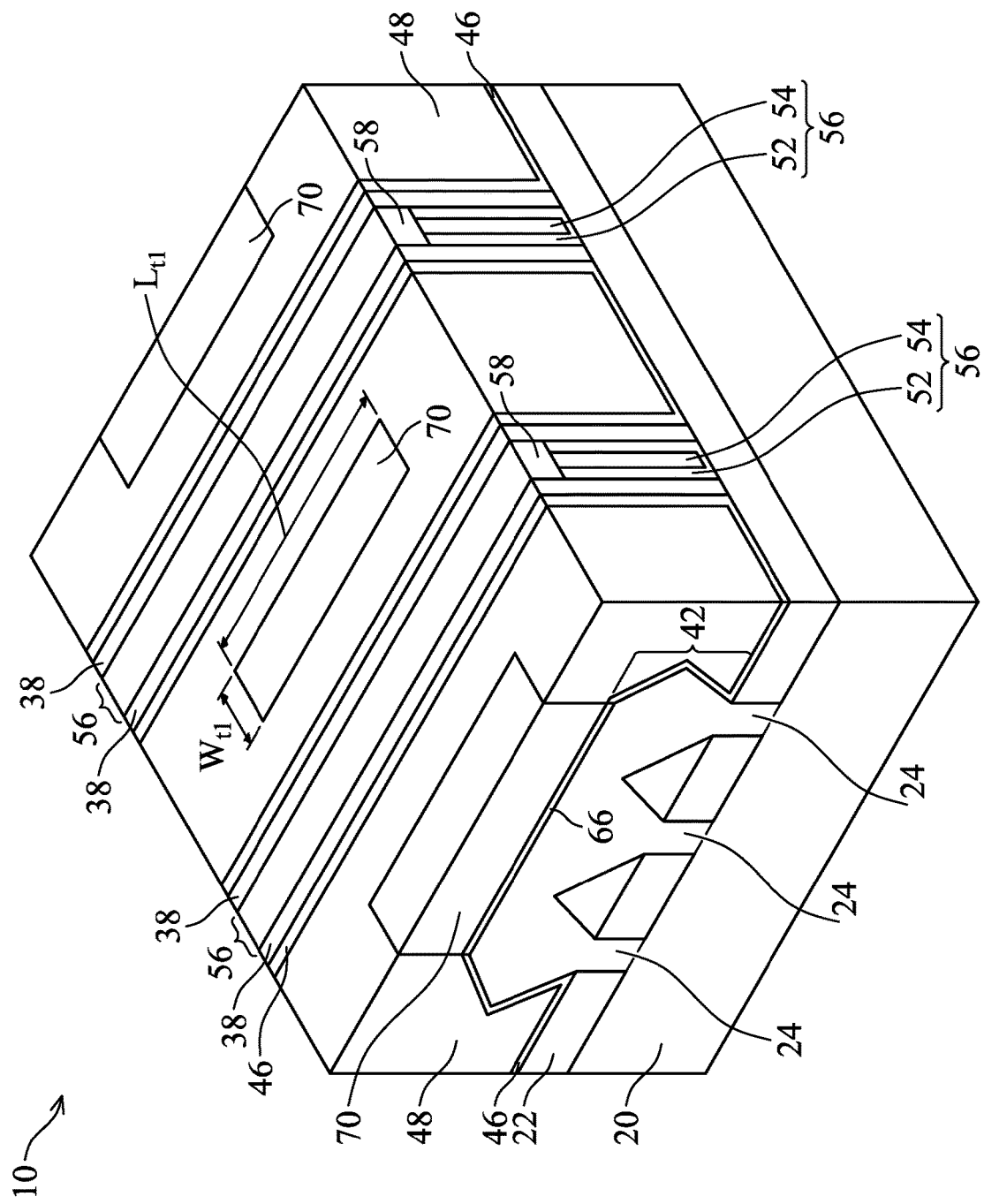
Figure 10B:
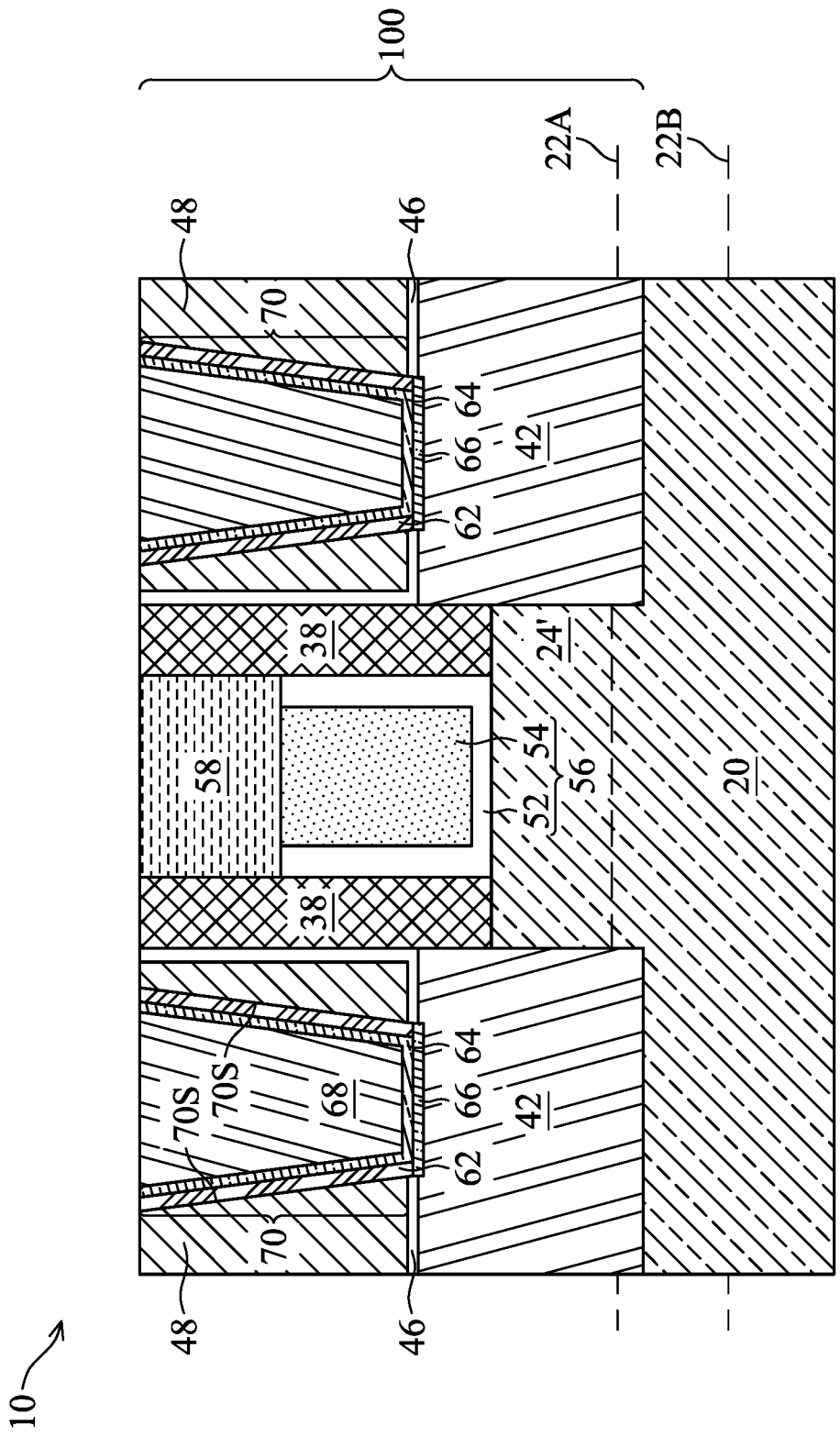

Referring to FIGS. 10A and 10B, silicide regions 66 and source/drain contact plugs 70 are formed. In accordance with some embodiments, metal layer 62 (such as a titanium layer or a cobalt layer, FIG. 10B) is deposited, for example, using Physical Vapor Deposition (PVD) or a like method. Metal layer 62 is a conformal layer, and extends onto the top surface of source/drain regions 42 and the sidewalls of ILD 48. A metal nitride layer (such as a titanium nitride layer) 64 is then deposited as a capping layer. An annealing process is then performed to form source/drain silicide regions 66, as shown in FIGS. 10A and 10B. The respective process is illustrated as process 220 in the process flow 200 shown in FIG. 19. Next, a metallic material 68 such as cobalt, tungsten, or the like, is filled into the remaining portions of the contact openings. A planarization process such as a CMP process or a mechanical grinding process is then performed to remove excess portions of metal layer 62 and the metallic material 68, leaving contact plugs 70. The respective process is also illustrated as process 220 in the process flow 200 shown in FIG. 19. FinFET 100 is thus formed. Contact plugs 70 have sidewalls 70S, which may be straight and slanted, for example, with tilt angle α1 smaller than 90 degrees.

Figure 11:
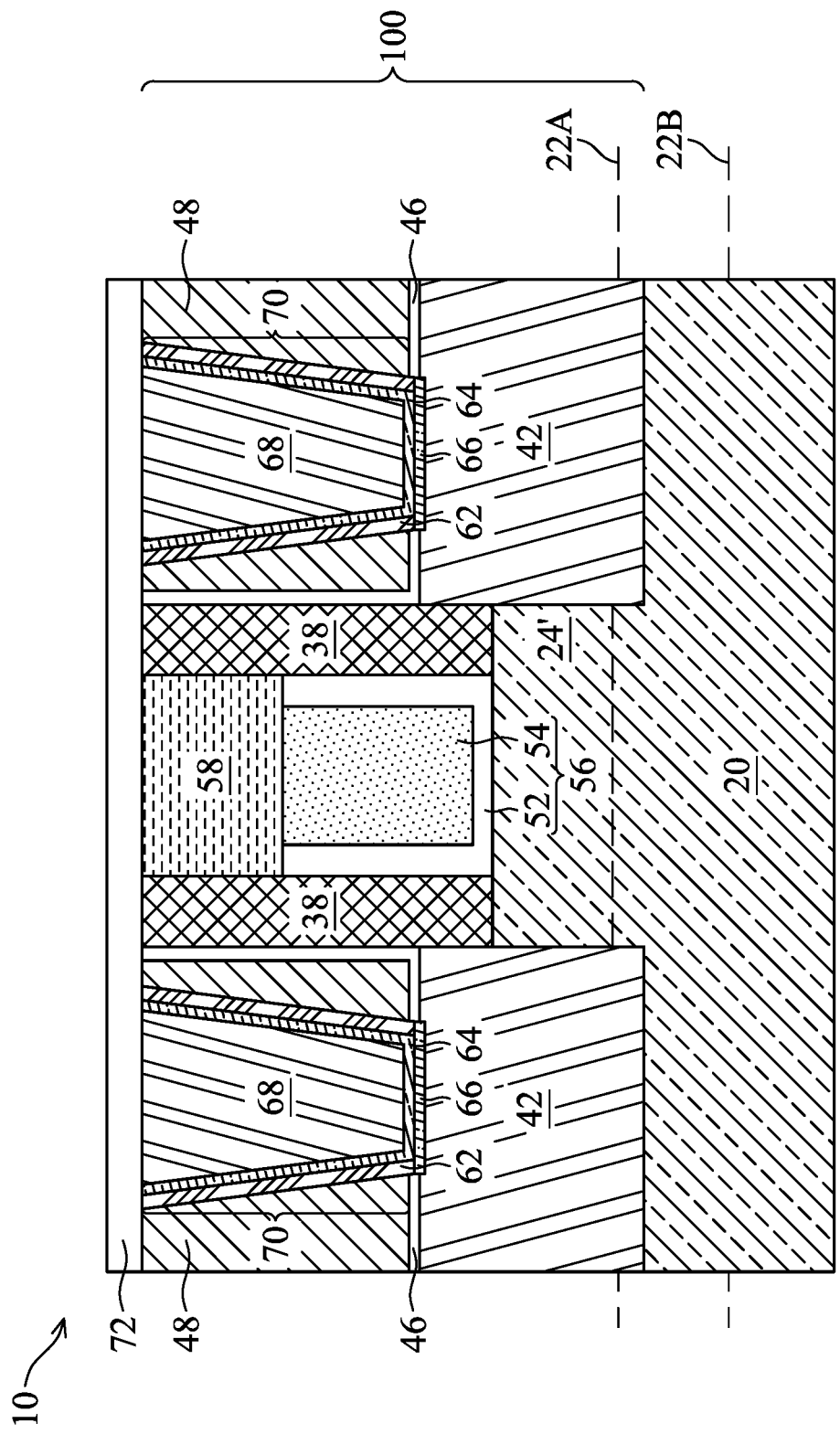

Referring to FIG. 11, etch stop layer 72 is deposited. The respective process is illustrated as process 222 in the process flow 200 shown in FIG. 19. Etch stop layer 72 may be formed of a silicon-containing material such as SiN, SiCN, SiC, SiOCN, or the like, or may be formed of other non-silicon-containing dielectric materials. The formation method may include PECVD, ALD, CVD, or the like.

Figure 12A:
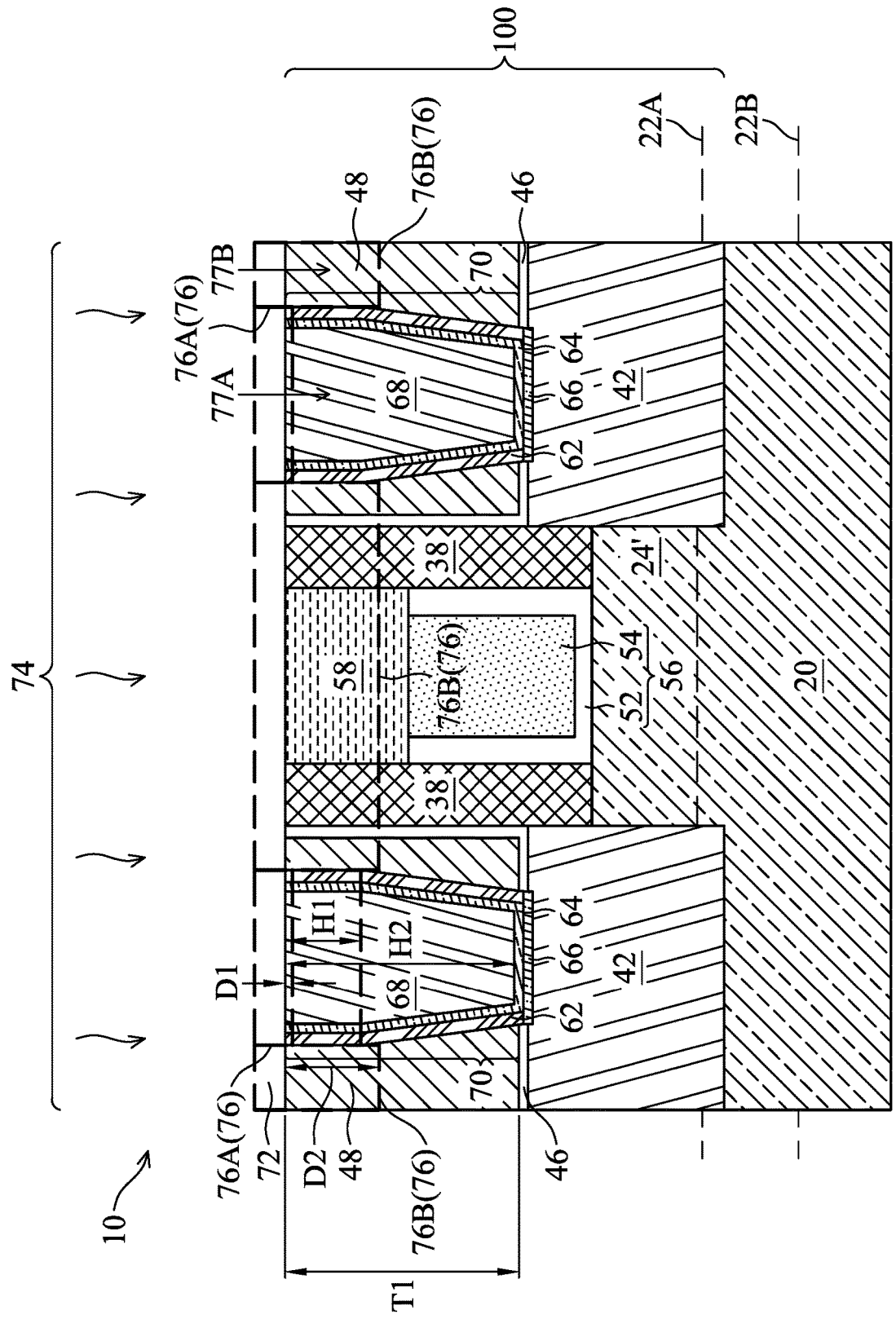
Figure 12B:
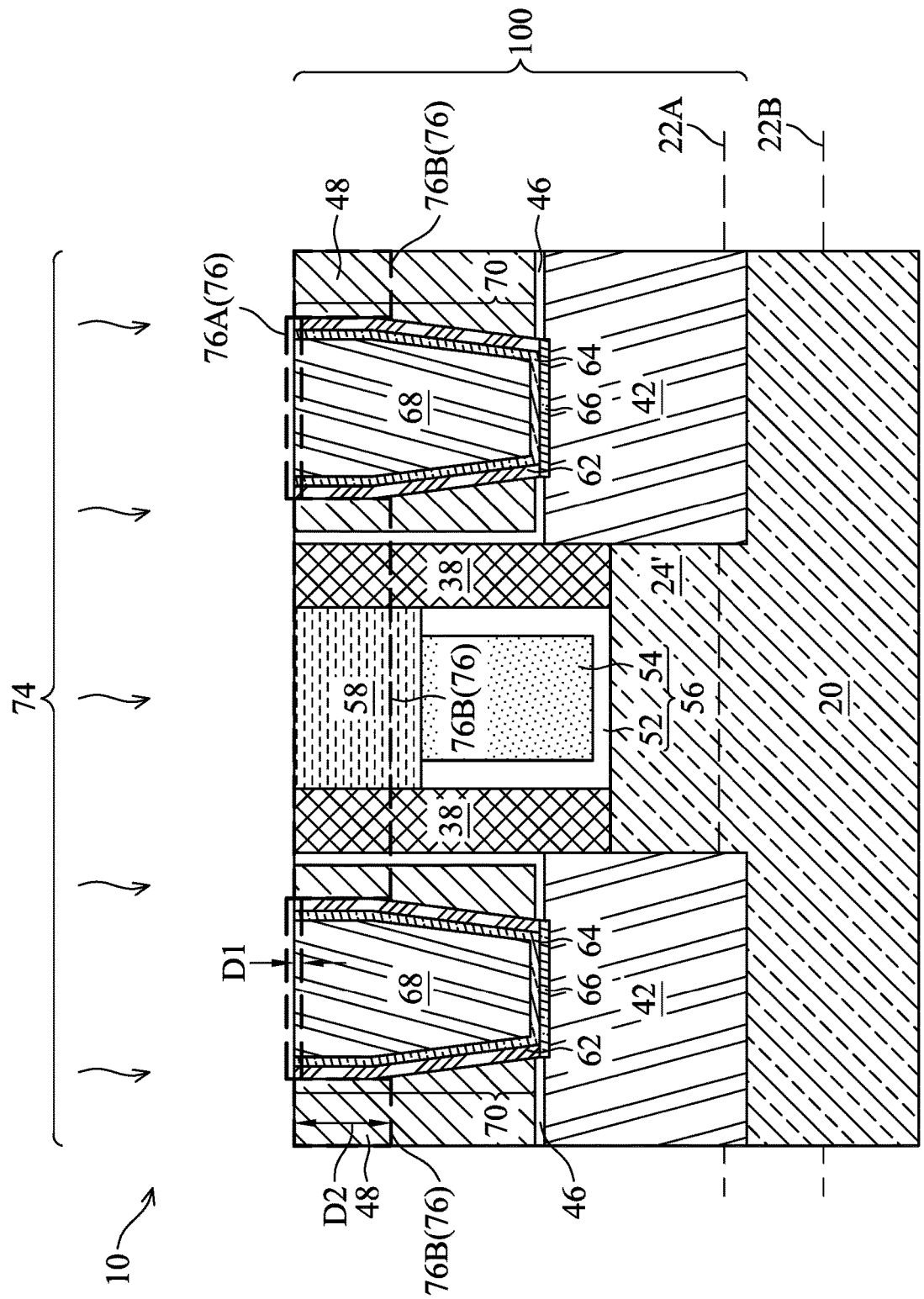
Figure 12C:
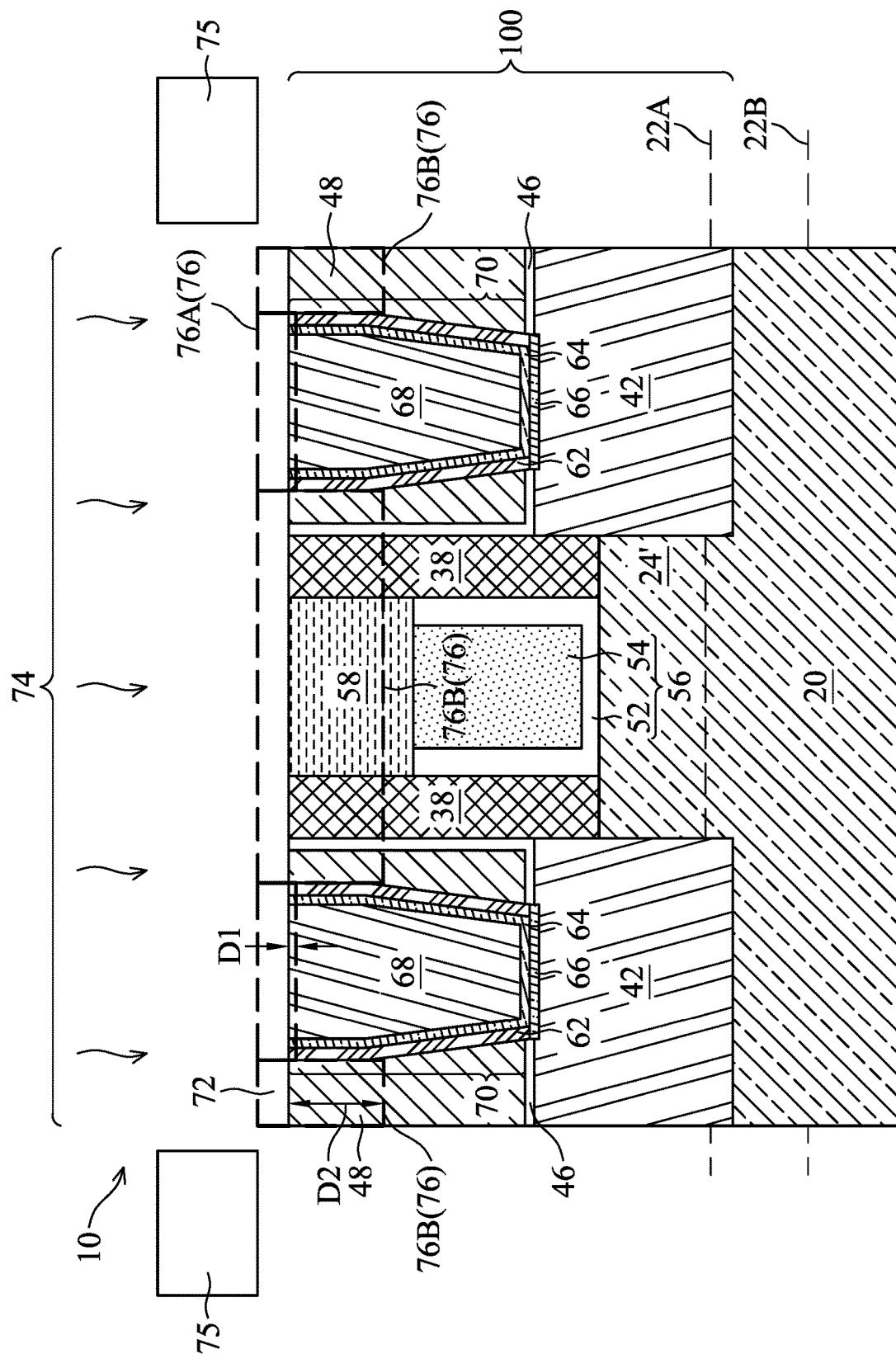

Referring to FIG. 12A, 12B, or 12C, an implantation process 74 is performed. The respective process is illustrated as process 224 in the process flow 200 shown in FIG. 19. In implantation process 74, a dopant is implanted to cause the volume of ILD 48, CESL 46, and gate spacers 38 to expand, so that contact plugs 70 are squeezed, and their lateral dimensions are reduced, as will be discussed in detail subsequently. In accordance with some embodiments, the dopant comprises Ge, Xe, Ar, Si, or combinations thereof.

Figure 12D:
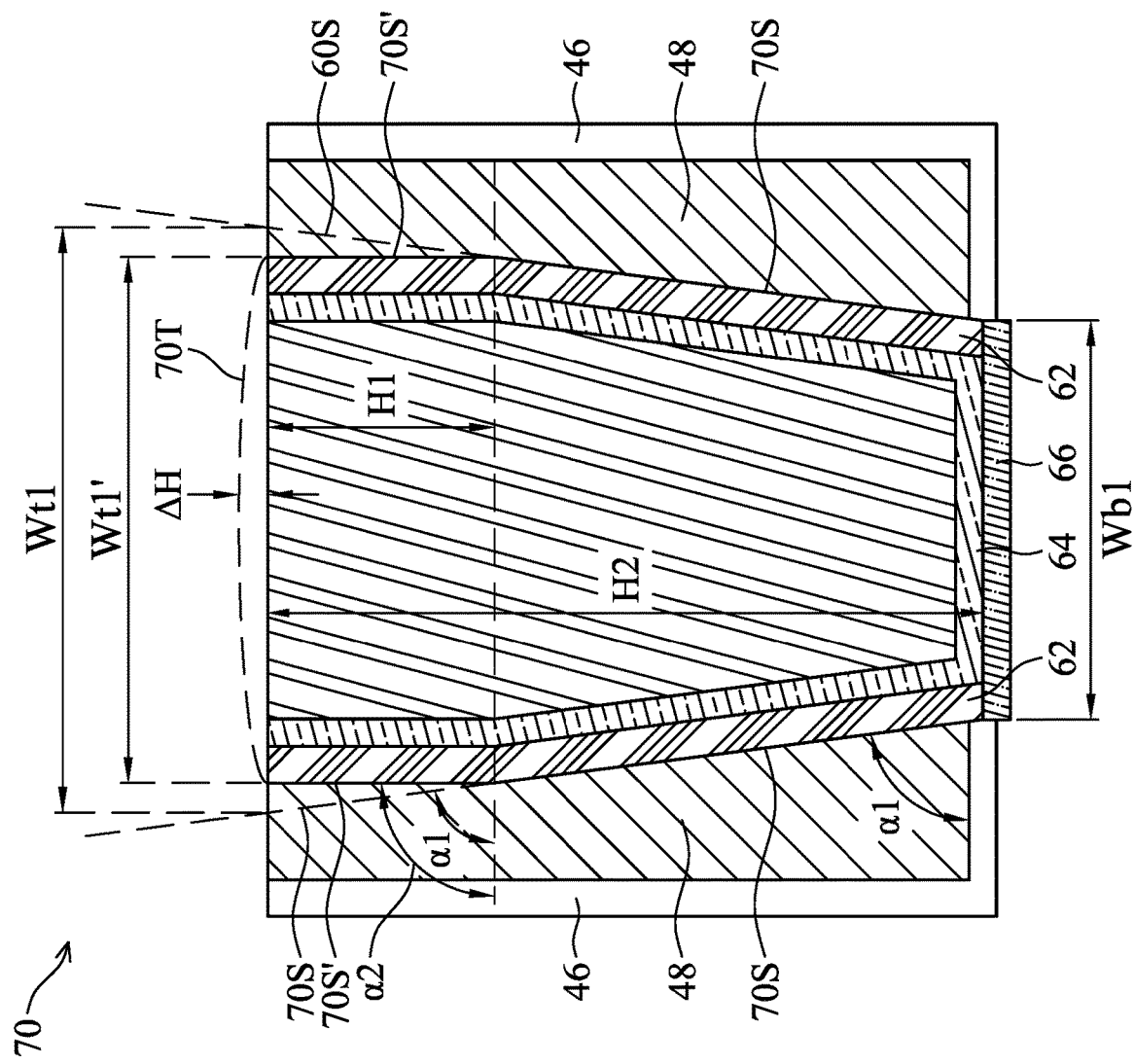

FIG. 12D illustrates a cross-sectional view of contact plug 70 after the implantation process 74. To show the results of the implantation process, the sidewalls 70S of the top portion of contact plug 70 before the implantation process 74 is shown using dashed lines, and the sidewalls 70S' of the top portion of contact plug 70 after the implantation process 74 is shown using solid lines. In accordance with some embodiments, the top portion of contact plug 70 is shrunk in the widthwise direction due to the implantation process. The shrunk of the top portion of contact plug 70 may be caused by the implantation of the dopant into dielectric layers such as ILD 48, CESL 46, and gate spacers 38, so that these dielectric layers expand in volume, and squeeze contact plug 70, so that the top lateral dimension of contact plug 70 is reduced from Wt1 to Wt1'. In accordance with some embodiments, the difference (Wt1−Wt1') is greater than about 1 nm, and may be in the range between about 1 nm and about 5 nm. On the other hand, the dopant reaching to the lower portion of ILD 48 (if any) has a very small amount, and does not change the bottom lateral dimension Wb1.

Furthermore, referring to FIG. 10A, contact plug 70 may have top length Lt1 greater than top width Wt1. Contact plug 70 is more difficult to shrink, when squeezed, in the lengthwise direction than in the widthwise direction. The greater the top length Lt1, the smaller the shrink value (Lt1−Lt1') will be, wherein Lt1' is the top length after the implantation process 74. Accordingly, shrink value (Lt1−Lt1') is smaller than (Wt1−Wt1'). In accordance with some embodiments, the shrink value (Lt1−Lt1') is smaller than about 0.5 nm, smaller than about 0.2 nm, or smaller than about 0.1 nm.

Referring back to FIG. 12D, as a result of the implantation process, contact plug 70 may become taller since the total volume of contact plug 70 is essentially unchanged. The increase ΔH in height may be greater than about 3 nm, and may be in the range between about 1 nm and about 10 nm. The top surface 70T of contact plug 70 may become rounded, and the rounded portion may protrude higher than the top surface of ILD 48. Dashed line 70T shows a possible profile of the rounded top surface of contact plug 70.

Furthermore, due to the implantation process 74, the sidewalls of the top portions of contact plug 70 is changed in position, with the top sidewall portions before the implantation process being illustrated as 70S, and the top sidewall portions after the implantation process illustrated as being 70S'. In accordance some embodiments, the straight sidewalls 70S (before the implantation process 74) may have a tilt angle α1 smaller than 90 degrees. Tilt angle α1 may also be smaller than about 70 degrees, and may be in the range between about 60 degrees and about 85 degrees. The straight sidewall portions 70S' (after the implantation process 74) of the top portion of contact plug 70 may have a tilt angle α2 greater than tilt angle α1. Tilt angle α2 may be greater than about 85 degrees, and may be in the range between about 70 degrees and about 100 degrees. The difference (α2−α1) may be in the range between about 1 degree and about 15 degrees.

In accordance with some embodiments, the top portion of contact plug, which top portion is shrunk laterally by the implantation process, has a height H1, which may be in the range between about 3 nm and about 10 nm. Furthermore, the ratio H1/H2 (with H2 being the total height of contact plug 70) may be greater than about 0.15, and may be in the range between about 0.15 and about 0.5.

To achieve the lateral shrinking of the top portion of contact plugs 70, the energy of the implantation is selected to be in a range, which is not too high and not too low. If the implantation energy is too high, the dopant may penetrate through etch stop layer 72, ILD 48 and CESL 46 and reach source/drain regions 42. This may adversely change the property of the resulting FinFET in an un-controllable way. If the implantation energy is too low, the dopant cannot extend into ILD 48 deep enough, and hence height H1 (FIG. 12D) of the shrunk portion is too small. In accordance with some embodiments, the implantation process 74 may be performed with an energy in the range between about 2 keV and about 50 keV. The dosage of the dopant is also selected so that it is not too high to change the characteristic of the etch stop layer 72, implanted ILD 48, and CESL 46 too much, and not too low so that the top portions of contact plugs is adequately shrunk in width. In accordance with some embodiments, the dosage is in the range between about 1E14/cm² and 1E16/cm². The energy and the dosage may be selected in combination so that the top 1/3 part of each of contact plug 70 is reduced in dimension by 1 nm or more.

Furthermore, to increase the magnitude of shrinking, the implanted dielectric layers such as ILD 48 may have increased atomic percentage of hydrogen. Experiment results revealed that with more hydrogen in the implanted dielectric materials adjacent to contact plugs 70, the shrinking of contact plugs 70 is more significant. This may be caused by the effect of breaking the bonds in the dielectric materials. For example, the Si—O bonds in the dielectric materials may be broken by the implantation process. The increased amount of hydrogen (as aforementioned in ILD 48) results in more hydrogen atoms to be available and connected to the broken bonds, and hence the volume of the implanted dielectric materials is increased compared to the volume before the implantation process.

The implantation process 74 may be performed vertically, or tilted with a tilt angle smaller than about 60 degrees. During implantation process 74, wafer 10 may be cooled or heated, or may be at the room temperature. For example, the temperature of wafer 10 may be in the range between about −100° C. and about 500° C. during the implantation.

Referring to FIGS. 12A, 12B, and 12C, as a result of implantation process 74, doped regions 76A are formed in contact plugs 70 and the corresponding overlying portions of etch stop layer 72, and doped regions 76B are formed in dielectric layers such as ILD 48, gate spacers 38, hard masks 58, and the corresponding overlying portions of etch stop layer 72. Since contact plugs 70 (particularly metal region 68) are formed of metal and hence are dense, the dopant is more likely to pile up at the top surfaces of metal regions 68. Doped region 76A thus extends into only a shallow surface portion of contact plugs 70, with the dopant concentrations significantly reduce in lower portions than the respective upper portions. The illustrated doped regions 76A and 76B may represent the regions with relatively high concentrations, for example, with concentrations smaller than the respective peak concentration values by differences that are smaller than two orders (or may be three orders). The doped regions doped with lower concentrations are not shown as parts of doped regions 76A and 76B. Since the metal region 68 is denser, and the dielectric layers are relatively loose, the depth D1 of the doped regions 76A is smaller than the depth D2 of the doped regions 76B in the dielectric layers. In accordance with some embodiments, the depth D1 is smaller than height H1. Also, the depth D2 is smaller than the total thickness T1 of CESL 46 and ILD 48, so that the bottom portions of contact plugs 70 are not laterally shrunk. Otherwise, the resistance of contact plugs 70 will be adversely increased. For example, ratio D2/T1 may be in the range between about 0.3 and about 1. Also, ratio D1/D2 may be in the range between about 0.05 and about 0.5. In accordance with some embodiments, depth D1 is in the range between about 1 nm and about 5 nm, and depth D2 is in the range between about 5 nm and about 20 nm.

In accordance with some embodiments, as shown in FIG. 12A, implantation process 74 is performed on wafer 10 without any implantation mask, and is performed through etch stop layer 72. Since there is no implantation mask, an entirety of wafer 10 is subject to the implantation, and all surface features of the wafer 10 receive the dopant. In accordance with alternative embodiments, as shown in FIG. 12B, the implantation is performed without etch stop layer 72 being formed. It is appreciated that implanting with or without etch stop layer 72 may have different effects. For example, the implanted dopant may have a distribution (sometimes Gaussian distribution), with the peak concentration of the dopant being either at the surface of the implanted features, or at a certain depth below the top surface of the implanted features, depending on the type of dopant, the implantation energy, etc. The implantation with or without the etch stop layer provides a mean to adjust the peak concentration position/level in order to achieve maximum result. For example, without the etch stop layer, the peak concentration may be at a deeper level, while with the etch stop layer, the peak concentration may be a shallower level.

In accordance with yet alternative embodiments, as shown in FIG. 12C, the implantation is performed with implantation mask 75 being formed to mask the regions not to be implanted. For example, implantation mask 75 may be formed in the regions far away from contact plugs 70, because the expansion of the far-away regions will not cause the squeezing of contact plugs 70. Implanting with implantation mask may limit the implanted region in desirable regions without affecting other regions. For example, when Si or Ge is implanted, and when the dopant concentration is high, the leakage current between neighboring conductive features such as neighboring contact plugs 70 may increase due to the high-concentration of Si or Ge in dielectric layers. The implantation mask may prevent such increase in leakage current since the Si/Ge will not be doped into a continuous region connecting two neighboring conductive features. On the other hand, in some situations such as when there is no leakage concern (when Xe and/or Ar are implanted or when the dopant concentration is low), the cost of the implantation mask may be saved by not forming the implantation mask. It is appreciated that in FIG. 12C, etch stop layer 72 is illustrated as being dashed to indicate that at the time implantation process 74 is performed, etch stop layer 72 may or may not be formed.

Figure 16:
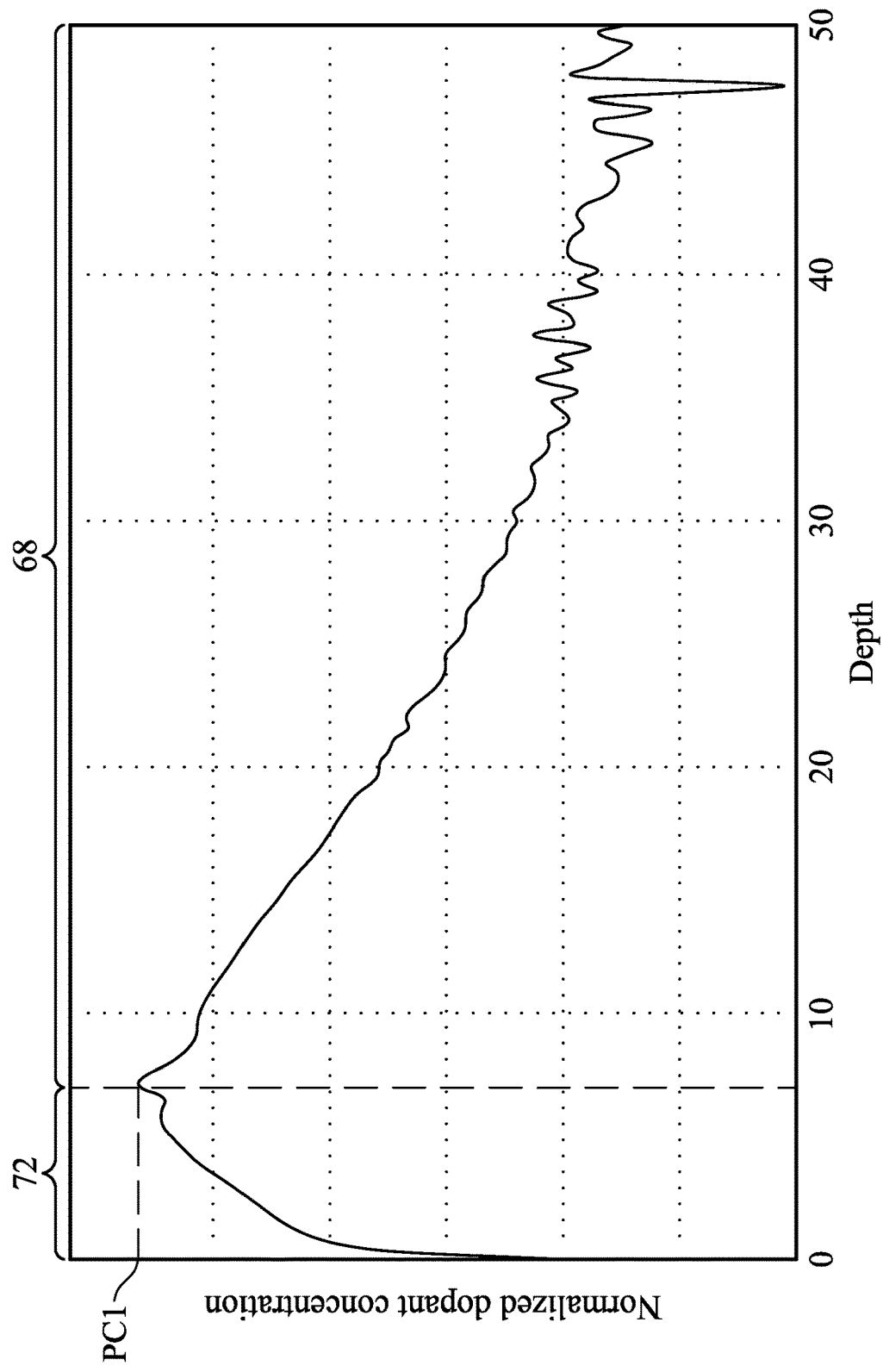
FIGS. 16 and 17 are profiles of implanted species in a contact plug and an inter-level dielectric, respectively, in accordance with some embodiments.

Since metal region 68 is dense, the dopant is piled up around (both higher than and lower than) the top surface of metal region 68. Also, the dopant may have some portions directly over metal region 68 and extend into at least the lower portions of etch stop layer 72. This causes doped regions 76A to extend into at least the lower portion, and possibly extend into the entirety, of etch stop layer 72. FIG. 16 illustrates a vertical distribution profile of the dopant in metal region 68 and etch stop layer 72 in accordance with some embodiments. The distribution profile is measured on a sample wafer using Secondary-Ion Mass Spectrometry (SIMS). The X-axis shows the depth measured from the top surface of etch stop layer 72 and in the direction marked by arrow 77A in FIG. 12A. The Y-axis shows the normalized dopant concentration. It is observed that the peak dopant concentration of doped region is at the interface between etch stop layer 72 and metal region 68, indicating the pile-up of the dopant at the interface. Also, there is a high concentration of the dopant in etch stop layer 72, which may be caused by the back-scattering from metal region 68. Accordingly, as shown in FIG. 12A, doped region 76A is illustrated as extending into etch stop layer 72. In accordance with some embodiments, the dopant concentration in metal region 68 and etch stop layer 72 is in the range between about $1E17/cm^3$ and about $1E22/cm^3$. The peak dopant concentration PC1 in metal region 68 and etch stop layer 72 may be in the range between about $1E20/cm^3$ and about $1E22/cm^3$.

Figure 17:
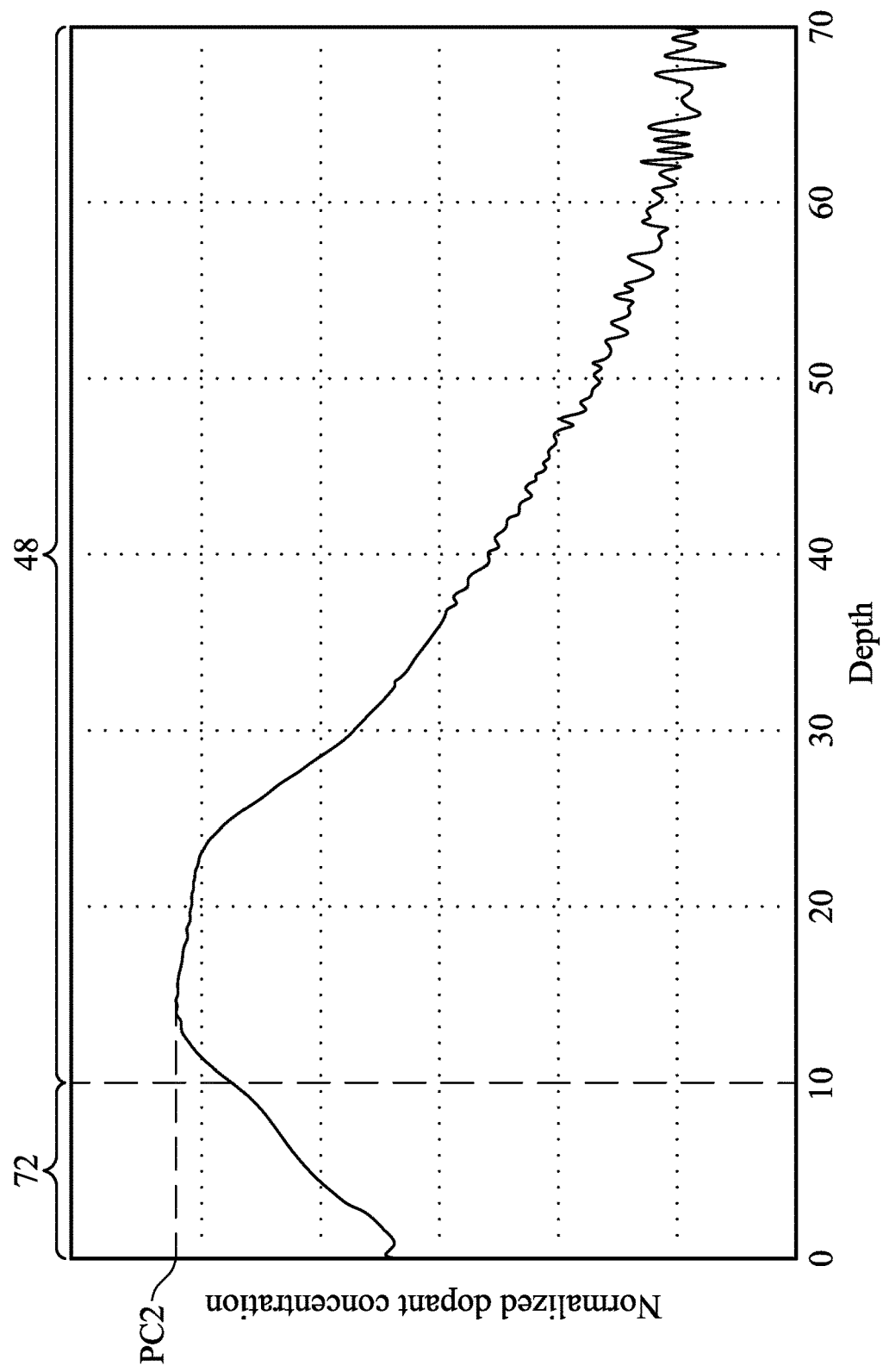

FIG. 17 illustrates a distribution profile of the dopant in ILD 48 and etch stop layer 72 in accordance with some embodiments. The distribution profile is also measured from the sample wafer using SIMS. The X-axis shows the depth measured from the top surface of etch stop layer 72 and in the direction marked by arrow 77B in FIG. 12A. The Y-axis shows the normalized dopant concentration. Since dielectric layers have smaller density values, the peak concentration of the doped regions 76B is inside ILD 48, rather than at the interface between etch stop layer 72 and ILD 48. The dopant in ILD 48 extends deeper than doped region 76A, but has less steep change than shown in FIG. 16. In accordance with some embodiments, the dopant concentration in etch stop layer 72 and ILD 48 is in the range between about $1E17/cm^3$ and about $1E22/cm^3$. The peak dopant concentration PC2 in etch stop layer 72 and ILD 48 may be in the range between about $1E17/cm^3$ and about $1E22/cm^3$. Peak dopant concentration PC2 may be lower than the peak dopant concentration PC1 (FIG. 16).

Referring to FIG. 12A, 12B, or 12C again, in accordance with some embodiments, the bottom parts of metal regions 68 have a dopant concentration (of the implanted dopant) that is at least three orders (1,000 times) lower than the peak dopant concentration at the interface between metal region 68 and etch stop layer 72. The bottom parts of metal regions 68 may be free from the implanted dopant in accordance with some embodiments. In accordance with some embodiments, the bottom parts of metal ILD 48 and the underlying part of CESL 46 have a dopant concentration (of the implanted dopant) that is at least three orders (1,000 times) or four orders lower than the peak dopant concentration in ILD 48. The bottom parts of ILD 48 may be free from the implanted dopant in accordance with some embodiments.

Figure 13:
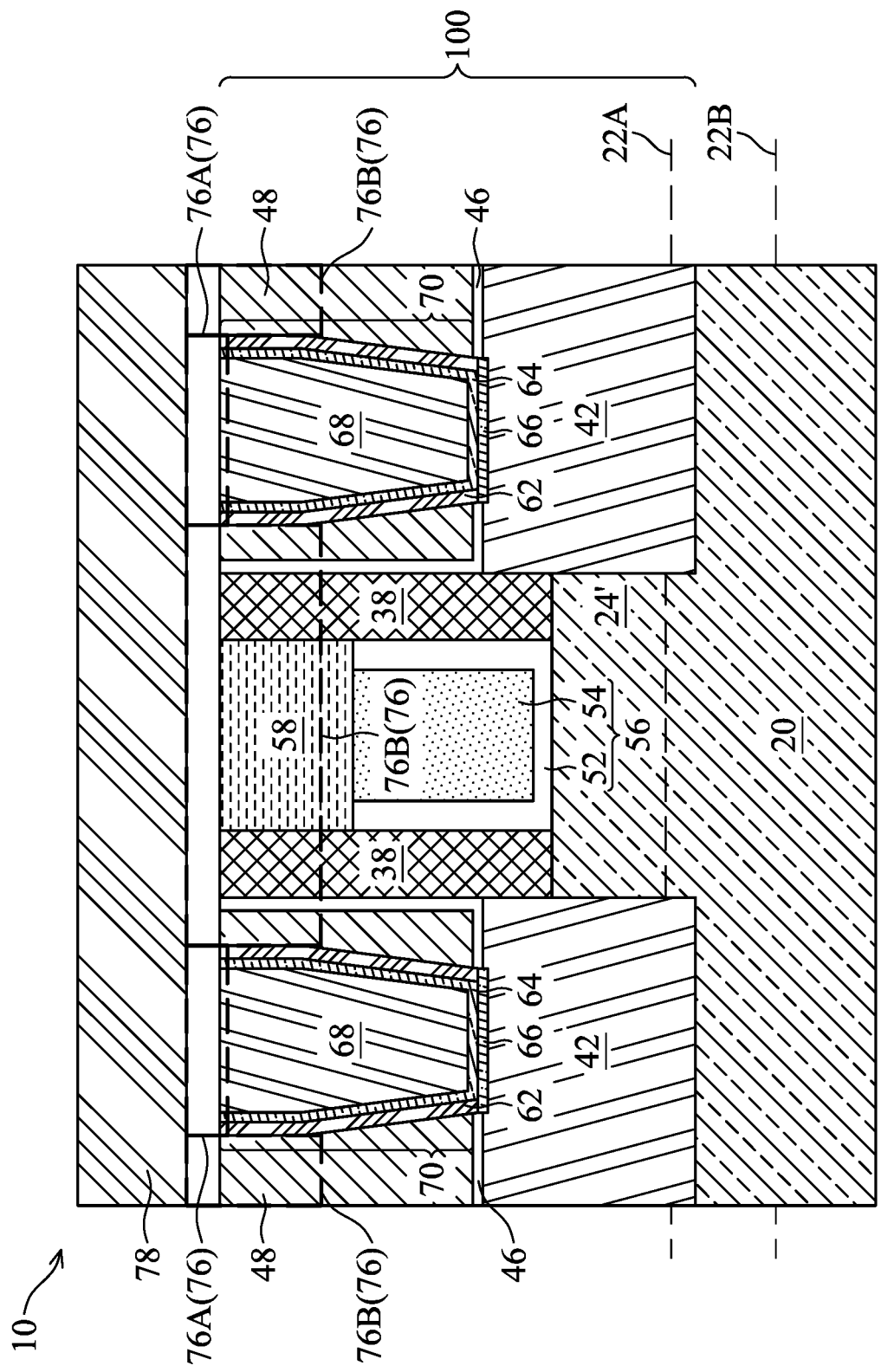

Referring to FIG. 13, ILD 78 is formed over etch stop layer 72. The respective process is illustrated as process 226 in the process flow 200 shown in FIG. 19. The material and the formation method of ILD 78 may be selected from the same candidate materials and formation methods, respectively, for forming ILD 48. For example, ILD 78 may include silicon oxide, PSG, BSG, BPSG, or the like, which includes silicon therein. In accordance with some embodiments, ILD 78 is formed using PECVD, FCVD, spin-on coating, or the like.

Figure 14:
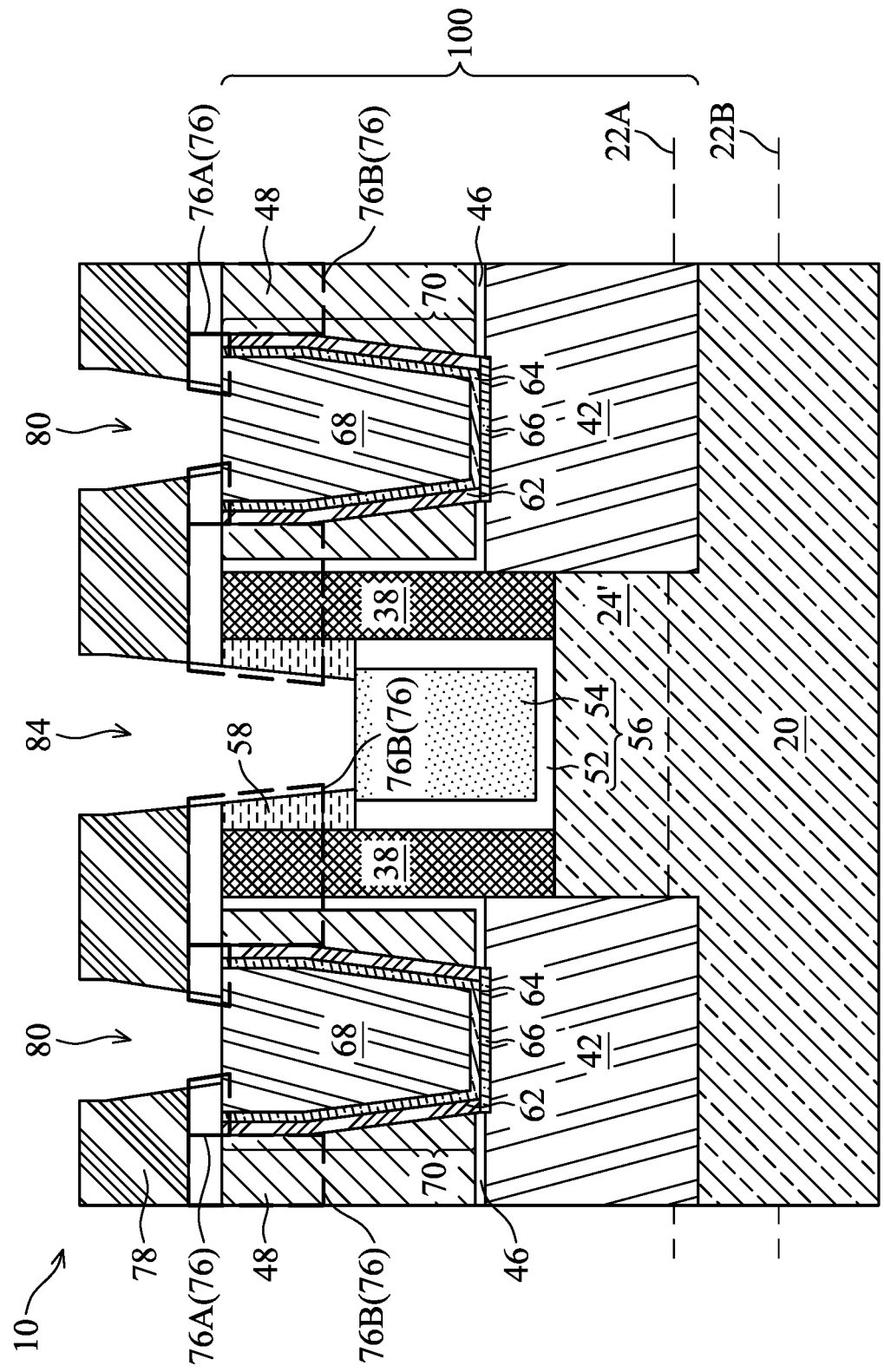

FIG. 14 illustrates the etching of ILD 78 to form source/drain contact openings 80. The respective process is illustrated as process 228 in the process flow 200 shown in FIG. 19. In accordance with some embodiments, ILD 78 is etched using a process gas including $C_2F_6$, $CF_4$, $SO_2$, the mixture of HBr, $Cl_2$, and $O_2$, or the mixture of HBr, $Cl_2$, $O_2$, and $CF_2$ etc. The etching processes are anisotropic.

Next, as also shown in FIG. 14, etch stop layer 72 is etched in an anisotropic process. The respective process is also illustrated as process 228 in the process flow 200 shown in FIG. 19. Source/drain contact plugs 70 are thus exposed to source/drain contact openings 80. Etch stop layer 72 may be etched using a fluorine-containing gas such as the mixture of $CF_4$, $O_2$, and $N_2$, the mixture of $NF_3$ and $O_2$, $SF_6$, or, the mixture of $SF_6$ and $O_2$. The etching may be anisotropic or isotropic.

FIG. 14 further illustrates the formation of gate contact opening 84 in accordance with some embodiments, which is formed by etching ILD 78, etch stop layer 72, and hard mask 58. The respective process is illustrated as process 230 in the process flow 200 shown in FIG. 19. In the following discussed example embodiments as shown in FIGS. 16 and 17, gate contact plug 88 and source/drain contact plugs 86 are formed sharing a common metal-filling process. It is appreciated that gate contact plug 88 may also be formed before or after the formation of source/drain contact plugs 86.

Figure 15:
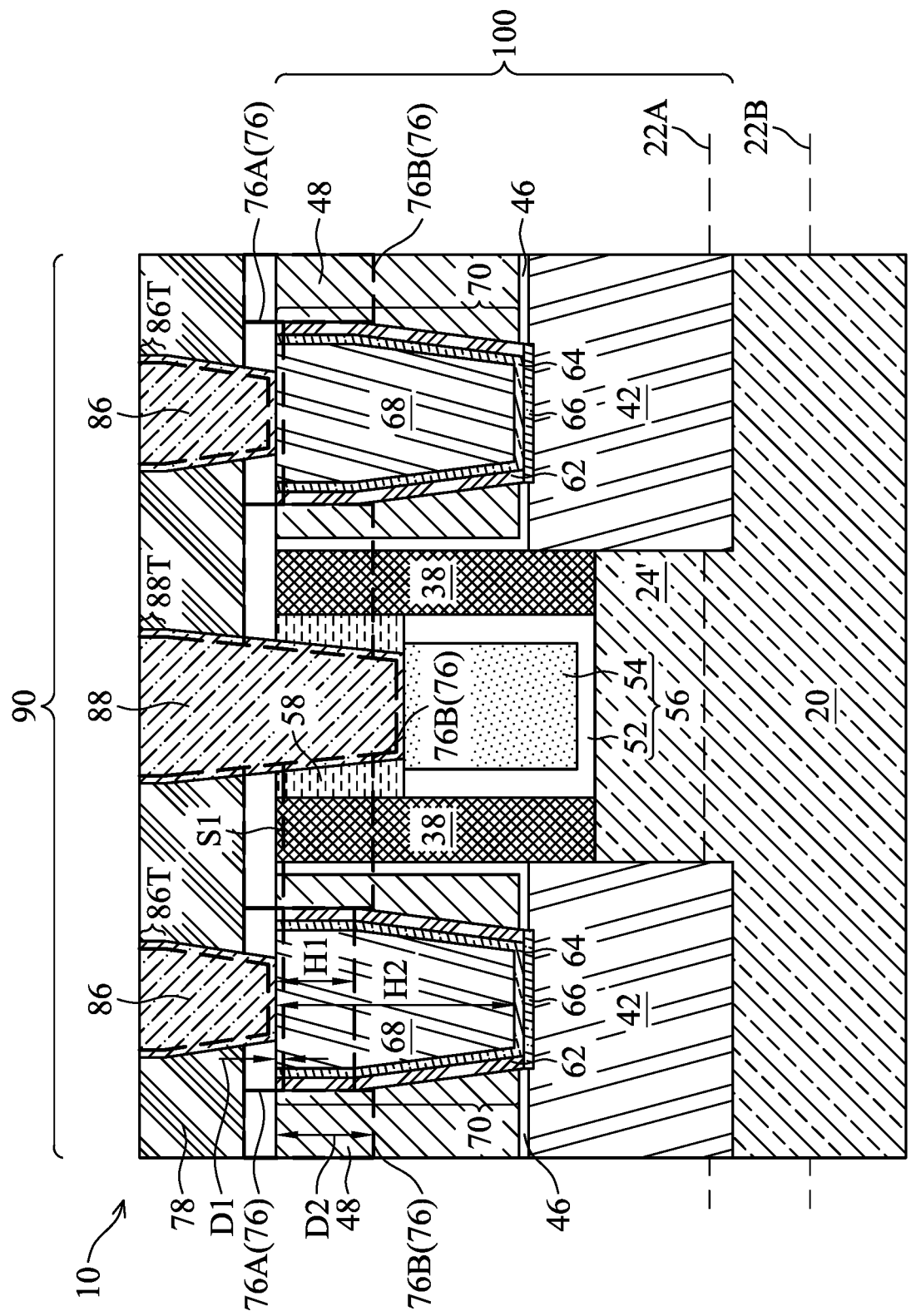

FIG. 15 illustrates the formation of source/drain contact plugs 86 and gate contact plug 88 in openings 80 and 84, respectively. The respective process is illustrated as process 232 in the process flow 200 shown in FIG. 19. In accordance with some embodiments, the formation process includes the deposition of a metallic material(s), which may be deposited using PVD, CVD, plating, combinations thereof, or the like, followed by a planarization process to remove excess portions of the metallic material(s). The deposited metallic material(s) may include tungsten, cobalt, molybdenum, copper, or alloys thereof. The metallic material may be the same as or different from the material of metal region 68. For example, when metal region 68 is formed of or comprises cobalt, metallic material may be formed of or comprises tungsten or cobalt. In accordance with some embodiments, source/drain contact plugs 86 and gate contact plug 88 are glue-less, wherein the entirety of each of source/drain contact plugs 86 and gate contact plug 88 is formed of a homogenous material, with no glue layer formed. In accordance with alternative embodiments, each of source/drain contact plugs 86 and gate contact plug 88 includes a glue layer, which may be formed of titanium, titanium nitride, tantalum, tantalum nitride, or the like. The deposited metallic material such as tungsten, cobalt, or the like is thus deposited over the glue layer. Accordingly, dashed lines are illustrated to show the possible boundaries between the glue layers and the overlying metallic material.

As shown in FIG. 15, the spacing S1 between contact plug 70 and its neighboring conductive feature such as gate contact plug 88 may be very small. The leakage current between contact plug 70 and its neighboring conductive features is related to spacing S1, and the greater the spacing S1, the smaller the leakage current is. In order to reduce the leakage current, either the pitches between contact plug 70 and its neighboring conductive features are increased, or the pitches are not increased, while contact plugs 70 are formed narrower. Both approaches have drawbacks. Increasing the pitches has the adverse effect of increasing the size of FinFET 100, while making contact plugs 70 narrower results in higher resistance. In accordance with the embodiments of the present disclosure, the contact plugs such as contact plug 70 may have wider upper portions than the respective lower portions, and the upper portion is the major source of leakage. Therefore, by shrinking the upper portions so that the upper portions (not the lower portions) are made smaller, the major part of the leakage current is reduced. This does not significantly increase the resistance of contact plugs 70 since the wider upper parts of the contact plugs 70 are not the major contributor of the resistance.

In accordance with some embodiments, an additional implantation process 90 is performed to laterally shrink the top portions 86T and 88T of source/drain contact plugs 86 and gate contact plug 88, respectively. The respective process is illustrated as process 234 in the process flow 200 shown in FIG. 19. Implantation process 90 may be essentially the same as implantation process 74 (FIG. 12A, 12B, or 12C), and hence the details of implantation process 90 are not repeated. In accordance with other embodiments, the additional implantation process 90 is not performed. Whether to perform the additional implantation process 90 or not may be related to the main material of contact plugs 86 and 88. For example, cobalt shrinks more than tungsten when subjecting to implantation process 90. Accordingly, when cobalt is used to form source/drain contact plugs 86 and gate contact plug 88, implantation process 90 may be performed, while if tungsten is used to form source/drain contact plugs 86 and gate contact plug 88, the magnitude of the shrinking is less significant compared to cobalt, and implantation process 90 may be, or may not be, performed, depending on the performance requirement.

Figure 18:
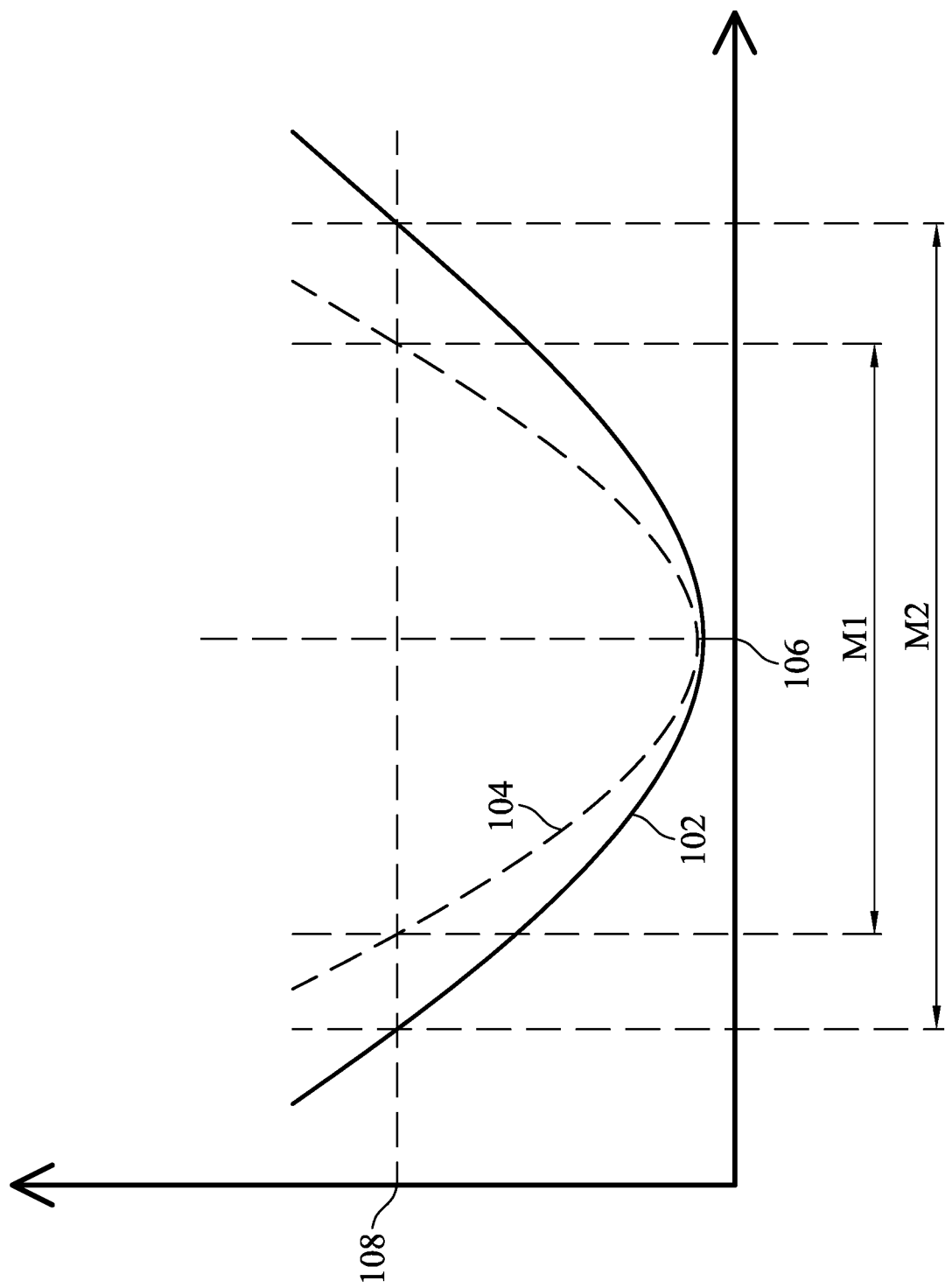
FIG. 18 illustrates the leakage current as a function of overlay shift in accordance with some embodiments.

FIG. 18 illustrates leakage currents as a function of overlay shift. Line 102 illustrates a result obtained from a sample formed adopting an embodiment of the present disclosure. Line 104 illustrates a result obtained from a sample, whose formation of contact plugs does not include implantations for shrinking contact plugs. Overlay position 106 indicates that contact plug 70 is in the middle of two neighboring gate contact plugs, so that regardless of whether contact plug 70 is formed shifting to the left or shifting to the right, the leakage current will increase. Assuming 108 is the upper limit of the leakage current allowed by specification. Window (process margin) M1 is the process window of the conventional formation method, and window W2 is the process window of the embodiments of the present disclosure. FIG. 18 illustrates that the process window is increased from M1 to M2 by adopting the embodiments of the present disclosure.

The embodiments of the present disclosure have some advantageous features. By implanting the top portion of ILD, in which contact plugs are formed, the spacing between the contact plugs and their neighboring conductive features is increased, leading to the reduction of leakage currents. On the other hand, the sizes of the transistors are not increased, and the resistance values of the contact plugs are also not increased significantly.

In accordance with some embodiments of the present disclosure, a method includes forming a first dielectric layer over a source/drain region; forming a source/drain contact plug over and electrically connecting to the source/drain region, wherein a top portion of the source/drain contact plug has a first lateral dimension; performing an implantation process to implant a dopant into the first dielectric layer, wherein the implantation process results in the source/drain contact plug to have a second lateral dimension smaller than the first lateral dimension; forming a second dielectric layer over the first dielectric layer; and forming a gate contact plug adjacent to the source/drain contact plug. In accordance with an embodiment, in the implantation process, an element selected from the group consisting of Ge, Xe, Ar, Si, and combinations thereof is implanted. In accordance with an embodiment, in the implantation process, germanium is implanted. In accordance with an embodiment, in the implantation process, an additional top portion of the first dielectric layer is implanted, and an additional bottom portion of the first dielectric layer is not implanted. In accordance with an embodiment, the second lateral dimension is smaller than the first lateral dimension by a difference greater than about 1 nm. In accordance with an embodiment, the implantation process results in the source/drain contact plug to have an increased height. In accordance with an embodiment, the implanting process is performed before the etch stop layer is formed and when the first dielectric layer is exposed. In accordance with an embodiment, in the implanting process, etch stop layer is implanted. In accordance with an embodiment, the implantation process is performed without adopting a patterned implantation mask.

In accordance with some embodiments of the present disclosure, a structure includes an inter-layer dielectric; a source/drain contact plug in the inter-layer dielectric, wherein an upper portion of the inter-layer dielectric comprises a dopant having a first dopant concentration, and a lower portion of the inter-layer dielectric has a second dopant concentration of the dopant, wherein the second dopant concentration is smaller than the first dopant concentration; a gate stack on a side of the source/drain contact plug; and a gate contact plug over and electrically coupling to the gate stack. In accordance with an embodiment, the dopant comprises germanium. In accordance with an embodiment, the lower portion of the inter-layer dielectric is substantially free from the dopant. In accordance with an embodiment, the structure further includes an etch stop layer over the source/drain contact plug and the inter-layer dielectric, wherein the etch stop layer comprises the dopant. In accordance with an embodiment, the source/drain contact plug comprises a sidewall comprising an additional lower portion, wherein the additional lower portion is straight; and an additional upper portion higher than the additional lower portion, wherein the additional upper portion has a first height greater than about 15 percent of a second height of the source/drain contact plug, and an entirety of the additional upper portion is more vertical than the additional lower portion.

In accordance with some embodiments of the present disclosure, a structure includes a source/drain region; a silicide region over and contacting the source/drain region; a first inter-layer dielectric; a first contact plug over and contacting the silicide region, with the first contact plug being extending into the first inter-layer dielectric; an etch stop layer over and contacting the first contact plug; a second inter-layer dielectric over and contacting the etch stop layer; a second contact plug extending into the second inter-layer dielectric; and a dopant having a first dopant concentration in a top portion of the first inter-layer dielectric, and a second dopant concentration in a bottom portion of the first inter-layer dielectric, wherein the first dopant concentration is at least two orders higher than the second dopant concentration. In accordance with an embodiment, the first dopant concentration is at least three orders higher than the second dopant concentration. In accordance with an embodiment, the first dopant concentration is greater than about 1E20/cm$^3$. In accordance with an embodiment, the bottom portion of the first inter-layer dielectric is free from the dopant. In accordance with an embodiment, the dopant is selected from the group consisting of Ge, Xe, Ar, Si, and combinations thereof. In accordance with an embodiment, the dopant comprises germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   an inter-layer dielectric;
   a source/drain contact plug in the inter-layer dielectric, wherein the source/drain contact plug comprises a sidewall, and the sidewall comprising:
      a first lower portion, wherein the first lower portion is straight; and
      a first upper portion higher than the first lower portion, wherein an entirety of the first upper portion is more vertical than the first lower portion, wherein the first lower portion and the first upper portion are continuously joined to each other;
   a gate stack on a side of the source/drain contact plug; and
   a gate contact plug over and electrically coupling to the gate stack.

2. The structure of claim 1, wherein the first upper portion is straight.

3. The structure of claim 1, wherein the inter-layer dielectric comprises:
   a second upper portion comprising a dopant having a first dopant concentration; and
   a second lower portion lower than and joined to the second upper portion, wherein a second dopant concentration of the dopant in the second lower portion is lower than the first dopant concentration.

4. The structure of claim 3, wherein the dopant comprises germanium.

5. The structure of claim 3 further comprising an etch stop layer over and contacting the source/drain contact plug, wherein the etch stop layer comprises the dopant therein.

6. The structure of claim 5, wherein the dopant has a first peak concentration at an interface between the etch stop layer and the source/drain contact plug.

7. The structure of claim 3, wherein the dopant has a second peak concentration in the inter-layer dielectric, and a peak concentration of the dopant is lower than a top surface of the inter-layer dielectric.

8. A structure comprising:
a gate stack;
a source/drain region aside of the gate stack;
a silicide region over and contacting the source/drain region;
an inter-layer dielectric;
a source/drain contact plug over and contacting the silicide region, with the source/drain contact plug comprising a part in the inter-layer dielectric;
an etch stop layer over and contacting the source/drain contact plug and the inter-layer dielectric; and
a dopant having a first dopant concentration in a top portion of the inter-layer dielectric, and a second dopant concentration in a bottom portion of the inter-layer dielectric, wherein the first dopant concentration is higher than the second dopant concentration, and wherein the dopant has:
a first peak concentration at a location between the top portion and the bottom portion; and
a second peak concentration at an interface between the source/drain contact plug and the etch stop layer, and wherein the second peak concentration is higher than the first peak concentration.

9. The structure of claim 8, wherein the etch stop layer further comprises the dopant.

10. The structure of claim 9, wherein from the location where the first peak concentration occurs to an additional location in the etch stop layer, concentrations of the dopant reduce continuously.

11. The structure of claim 8, wherein the first peak concentration occurs in an upper portion of the inter-layer dielectric.

12. The structure of claim 8 further comprising
a dielectric hard mask over the gate stack; and
a gate spacer on sidewalls of the gate stack and the dielectric hard mask, wherein the dopant has a third dopant concentration of the dopant in the dielectric hard mask, and a fourth dopant concentration of the dopant in the gate stack, wherein the fourth dopant concentration is lower than the third dopant concentration.

13. The structure of claim 8 further comprising a gate contact plug over and contacting the gate stack, wherein an additional top portion of the gate contact plug comprises an additional dopant with a third dopant concentration, and wherein an additional lower portion of the gate contact plug comprises the additional dopant with a fourth dopant concentration lower than the third dopant concentration.

14. The structure of claim 8, wherein the first dopant concentration is at least three orders higher than the second dopant concentration.

15. The structure of claim 14, wherein the bottom portion of the inter-layer dielectric is free from the dopant.

16. The structure of claim 15, wherein the first dopant concentration is in a range between about $1E17/cm^3$ and about $1E22/cm^3$.

17. The structure of claim 8, wherein the dopant is selected from the group consisting of Ge, Xe, Ar, Si, and combinations thereof.

18. A structure comprising:
an inter-layer dielectric, wherein the inter-layer dielectric comprises:
a first upper portion comprising a dopant having a first dopant concentration; and
a first lower portion comprising the dopant having a second dopant concentration, wherein the second dopant concentration is smaller than the first dopant concentration;
a source/drain contact plug in the inter-layer dielectric, wherein the source/drain contact plug comprises a sidewall comprises:
a second upper portion comprising the dopant having a third dopant concentration; and
a second lower portion comprising the dopant having a fourth dopant concentration, wherein the fourth dopant concentration is smaller than the third dopant concentration;
a gate stack on a side of the source/drain contact plug; and
a gate contact plug over and electrically coupling to the gate stack.

19. The structure of claim 18, wherein the dopant comprises germanium.

20. The structure of claim 18, wherein the first lower portion and the second lower portion are free from the dopant.

* * * * *